(12) United States Patent
Miyagoshi et al.

(10) Patent No.: US 12,712,333 B2
(45) Date of Patent: Aug. 18, 2026

(54) SEMICONDUCTOR LASER DEVICE

(71) Applicant: Mitsubishi Electric Corporation, Tokyo (JP)

(72) Inventors: Ryosuke Miyagoshi, Tokyo (JP); Naoki Nakamura, Tokyo (JP); Naoki Kosaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1101 days.

(21) Appl. No.: 17/614,296

(22) PCT Filed: Aug. 6, 2019

(86) PCT No.: PCT/JP2019/030857
§ 371 (c)(1),
(2) Date: Nov. 24, 2021

(87) PCT Pub. No.: WO2021/024371
PCT Pub. Date: Feb. 11, 2021

(65) Prior Publication Data
US 2022/0166185 A1 May 26, 2022

(51) Int. Cl.
*H01S 5/02255* (2021.01)
*H01S 5/02212* (2021.01)
(Continued)

(52) U.S. Cl.
CPC ...... *H01S 5/02255* (2021.01); *H01S 5/02212* (2013.01); *H01S 5/0231* (2021.01); *H01S 5/02326* (2021.01)

(58) Field of Classification Search
CPC ............... H01S 5/0225; H01S 5/02255; H01S 5/02325; H01S 5/02326
See application file for complete search history.

(56) References Cited

U.S. PATENT DOCUMENTS 4,733,067 A * 3/1988 Oinoue ................ G11B 7/0909
5,517,479 A * 5/1996 Nakanishi .............. G11B 7/123
(Continued)

FOREIGN PATENT DOCUMENTS

JP S64-084687 A 3/1989
JP H02-090585 A 3/1990
(Continued)

OTHER PUBLICATIONS

International Search Report issued in PCT/JP2019/030857; mailed Nov. 5, 2019.

*Primary Examiner* — Sean P Hagan
(74) *Attorney, Agent, or Firm* — Studebaker Brackett PLLC

(57) ABSTRACT

A semiconductor laser device comprises a semiconductor laser element, a photodetector to receive laser light emitted from the semiconductor laser element, and a stem on which the semiconductor laser element and the photodetector are mounted. The semiconductor laser element is disposed on a side to a stem front face between the stem front face and a farthest portion of the photodetector farthest away from the stem front face of the stem on which the semiconductor laser element and the photodetector are mounted. The photodetector has a light receiving face for receiving the laser light and a reflective film formed thereon in which part of the laser light is transmitted and the rest is reflected, the light receiving face being formed on a side facing the semiconductor laser element.

3 Claims, 17 Drawing Sheets

(51) Int. Cl.

| | |
|---|---|
| ***H01S 5/0231*** | (2021.01) |
| ***H01S 5/02326*** | (2021.01) |

(56) References Cited

U.S. PATENT DOCUMENTS

| | | | | |
|---|---|---|---|---|
| 5,671,243 | A * | 9/1997 | Yap | H01S 5/02255 372/50.23 |
| 5,727,009 | A * | 3/1998 | Tajiri | G11B 7/22 |
| 5,793,785 | A * | 8/1998 | Nakanishi | H01S 5/02255 372/44.01 |
| 6,487,224 | B1 * | 11/2002 | Ohashi | H01S 5/02255 372/99 |
| 2002/0136256 | A1 * | 9/2002 | Hamasaki | G11B 7/123 |
| 2003/0053498 | A1 * | 3/2003 | Hamasaki | H01S 5/02255 372/36 |
| 2004/0012063 | A1 | 1/2004 | Kawano et al. | |
| 2004/0066815 | A1 * | 4/2004 | Okazaki | H01S 5/0087 372/36 |
| 2005/0116311 | A1 | 6/2005 | Kim et al. | |
| 2005/0145966 | A1 | 7/2005 | Kawano et al. | |
| 2005/0145967 | A1 | 7/2005 | Kawano et al. | |
| 2006/0261258 | A1 * | 11/2006 | Tawa | G02B 6/29361 250/214 R |
| 2008/0013584 | A1 * | 1/2008 | Freund | H01S 5/4056 372/50.122 |
| 2010/0226655 | A1 * | 9/2010 | Kim | H01S 5/02325 398/139 |
| 2017/0033528 | A1 * | 2/2017 | Tanisaka | H01S 5/02326 |

FOREIGN PATENT DOCUMENTS

| | | | | |
|---|---|---|---|---|
| JP | H02-076863 | U | | 6/1990 |
| JP | H03-145181 | A | | 6/1991 |
| JP | 104-253380 | A | | 9/1992 |
| JP | H04253380 | A | * | 9/1992 |
| JP | H07-162092 | A | | 6/1995 |
| JP | H08-116127 | A | | 5/1996 |
| JP | 2004-349395 | A | | 12/2004 |
| JP | 2005-072130 | A | | 3/2005 |
| JP | 2007-013202 | A | | 1/2007 |
| JP | 2009-200433 | A | | 9/2009 |

* cited by examiner 10
13
12
16
70
16
34
1
14
43
44
33
11
44
43
15b
15a 5
36
35
13
12
46
θ
47
50
37
45
θ

26
8
24
17
23
22
21
28
27
α
18

16
83
85
16
16
90
80
81a
81b
82a
82b
87
91
88
43
44
86
44
43
89b
89a 85
84
90
83
88
81b
80
81a
89b
89a
B
B
43
43
16
16
44
44
89d
43
87
92
88
43
89c 26
26
9
17
52
21
54
55

54
55
9

21
26
52
17
26

9

55
54
27

10
13
17
16
70
16
34
1
14
43
43
44
44
33
11
15b
15a 7
70
10
17
59
6
4
5
13
2
1
8
34
43
43
20
30
29
31
14
15c
11
15a

70

H1 30 10 16 16 15c 44 44 43 43 15d 32 13 16 16 15a 15b H2 H2 44 44 43 43 11 14 33 31 H1

SEMICONDUCTOR LASER DEVICE

TECHNICAL FIELD

The present application relates to a semiconductor laser device.

BACKGROUND ART

Patent Document 1 discloses a surface-emitting semiconductor laser with a monitor that comprises a laser part and a photodiode part for the monitoring integrated monolithically on the same semiconductor substrate and is provided with a separation groove having a laser-side end face perpendicular to the semiconductor substrate and a photodiode-side end face inclined to the semiconductor substrate. In the surface-emitting semiconductor laser with the monitor in Patent Document 1, the laser light emitted from the laser part is reflected at the photodiode-side end face, so that the laser light is output perpendicularly to the semiconductor substrate.

CITATION LIST

Patent Document

Patent Document 1: Japanese Patent Application Laid-open No. H1-84687 (FIG. 2)

SUMMARY OF INVENTION

Problems to be Solved by Invention

In the surface-emitting semiconductor laser with the monitor in Patent Document 1, since the laser part and the photodiode part for the monitoring (photodetector part) are monolithically integrated, there are many portions in the laser part and the photodiode part for the monitoring formed in common. Therefore, the front face of each layer (opposite side of the semiconductor substrate) of the laser part and the photodiode part for monitoring is identical. In the laser part which is a semiconductor laser, the laser light emitted to the photodiode-side end face, which is a light receiving face of the photodetector part, may spread out depending on the conditions of use, such as the amount of current inflow. The surface-emitting semiconductor laser with the monitor in Patent Document 1 has a problem in that, in the case where the laser light emitted from the laser part to the photodiode-side end face spreads out, the laser light spreading out on the side to a positive electrode (anode electrode) formed on the front face side cannot be reflected.

An object of the technology disclosed in the present application is to obtain a semiconductor laser device that can reflect even up to the tail of the laser light at the light receiving face of the photodetector even in the case where the laser light emitted from the semiconductor laser spreads out.

Means for Solving Problems

An example of a semiconductor laser device disclosed in the present application comprises a semiconductor laser element, a photodetector to receive laser light emitted from the semiconductor laser element, and a stem on which the semiconductor laser element and the photodetector are mounted. The semiconductor laser element is disposed on a side to a stem front face between the stem front face and a farthest portion of the photodetector farthest away from the stem front face of the stem on which the semiconductor laser element and the photodetector are mounted. The photodetector has a light receiving face for receiving the laser light and a reflective film formed thereon in which part of the laser light is transmitted and the rest is reflected, the light receiving face being formed on a side facing the semiconductor laser element.

Effect of Invention

In the example of the semiconductor laser device disclosed in the present application, the semiconductor laser element is disposed on the side of the stem front face between the farthest portion of the photodetector farthest away from the stem front face and the stem front face, and the reflective film in which part of the laser light is transmitted and the rest is reflected is formed on the light receiving face of the photodetector that receives the laser light, the light receiving face being formed on the side facing the semiconductor laser element, Therefore, even in the case where the laser light emitted from the semiconductor laser element, namely semiconductor laser spreads out, the laser light can be reflected by the light receiving face of the photodetector even up to the tail of the laser light.

MODES FOR CARRYING OUT INVENTION

Embodiment 1

Figure 1:
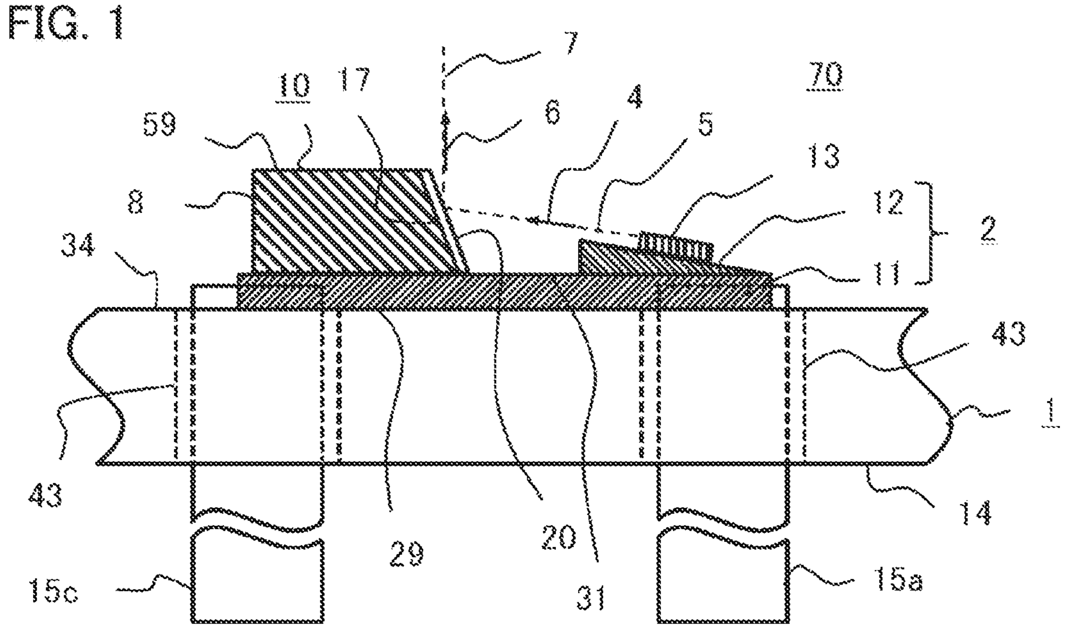
FIG. 1 is a cross-sectional view showing a semiconductor laser device according to Embodiment 1.
Figure 2:
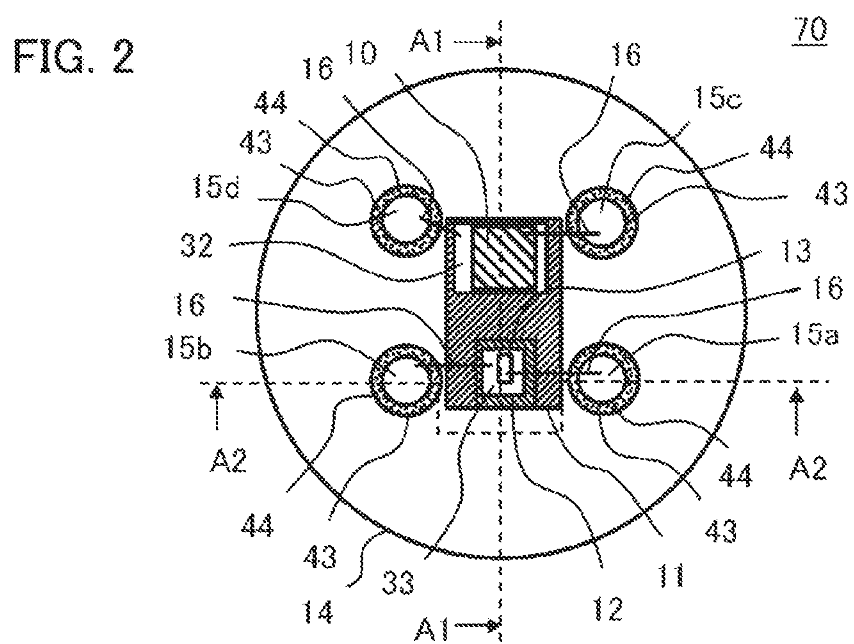
FIG. 2 is a plan view showing the semiconductor laser device according to Embodiment 1.
Figure 3:
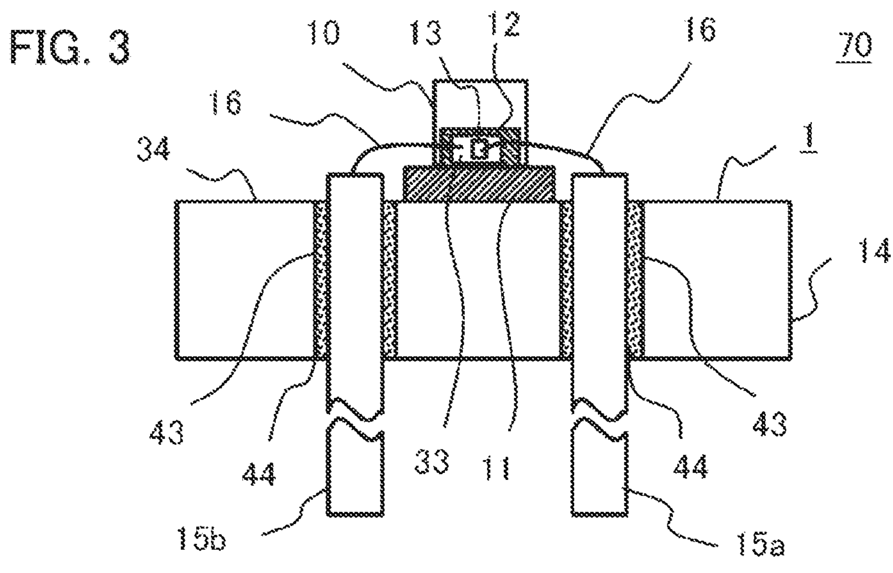
FIG. 3 is a cross-sectional view taken along the dashed line A2-A2 in FIG. 2.
Figure 4:
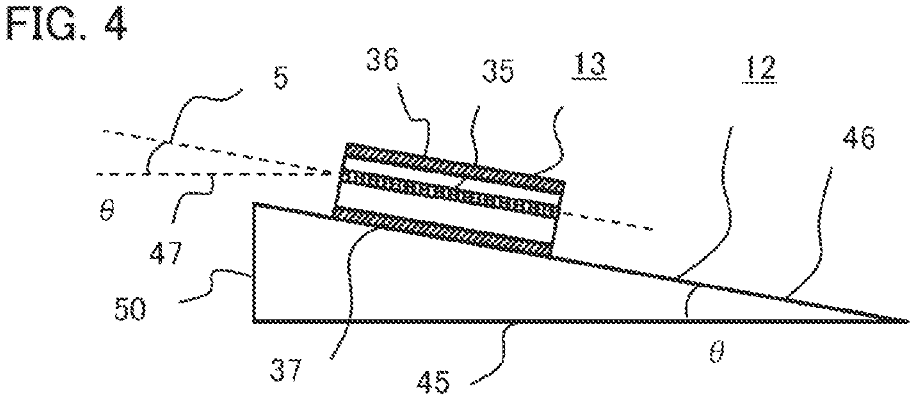
FIG. 4 is a diagram for illustrating an inclination angle of a second submount of FIG. 1.
Figure 5:
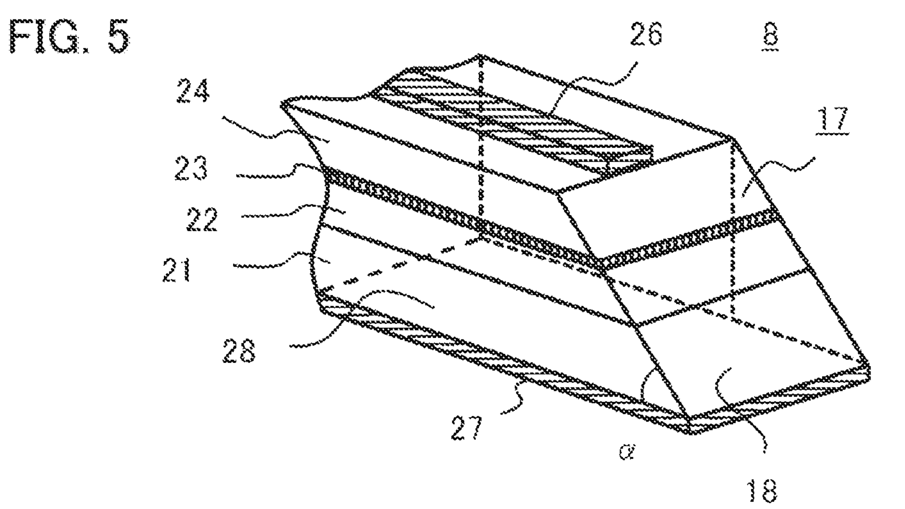
FIG. 5 is a perspective view of a waveguide type light receiving element of FIG. 1.
Figure 6:
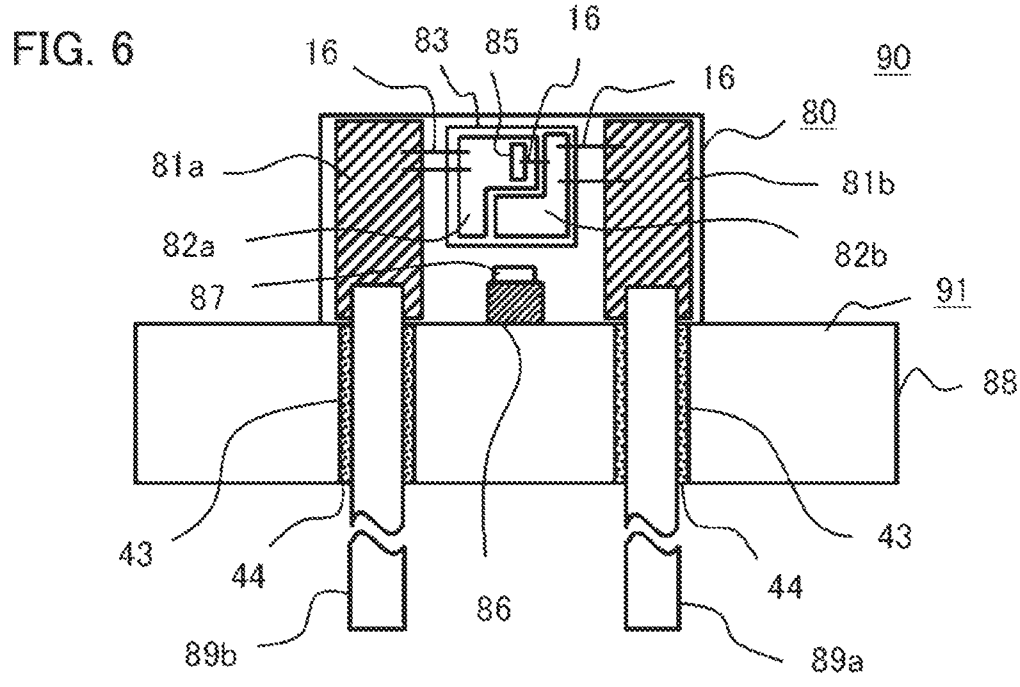
FIG. 6 is a cross-sectional view showing a semiconductor laser device according to a comparative example.
Figure 7:
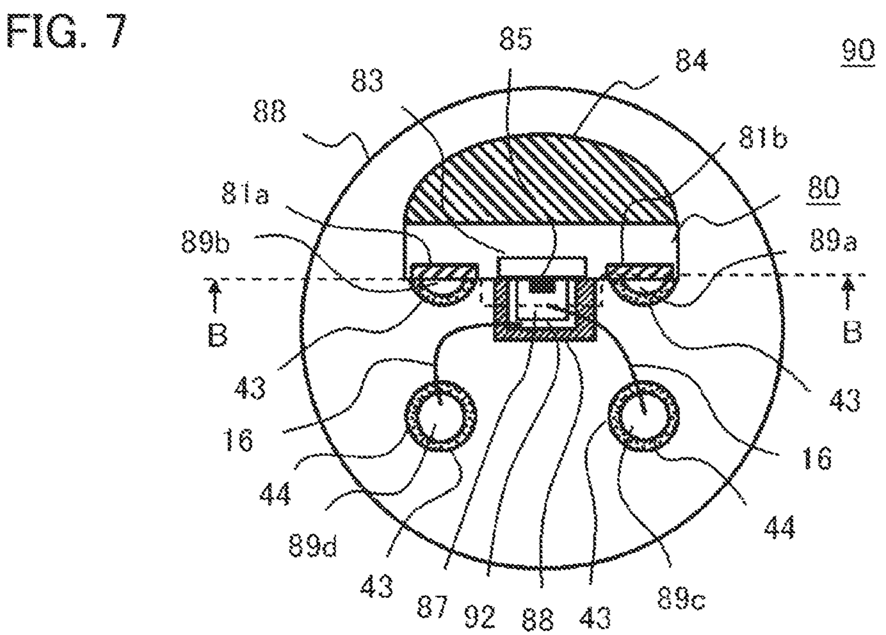
FIG. 7 is a plan view showing the semiconductor laser device of the comparative example.

A semiconductor laser device 70 of Embodiment 1 will be described referring to the drawings. The same or corresponding components are denoted by the same reference numerals, and repetitive description may be omitted. In other embodiments, the same or corresponding components are denoted by the same reference numerals, and repetitive description may be omitted. FIG. 1 is a cross-sectional view showing a semiconductor laser device according to Embodiment 1, and FIG. 2 is a plan view showing the semiconductor laser device according to Embodiment 1. FIG. 3 is a cross-sectional view taken along the dashed line A2-A2 in FIG. 2, and FIG. 4 is a diagram for illustrating an inclination angle of a second submount of FIG. 1. FIG. 5 is a perspective view showing a waveguide type light receiving element of FIG. 1. FIG. 6 is a cross-sectional view showing a semiconductor laser device of a comparative example, and FIG. 7 is a plan view showing the semiconductor laser device of the comparative example. FIG. 1 is the cross-sectional view taken along the dashed line A1-A1 in FIG. 2.

A semiconductor laser device 70 of Embodiment 1 comprises a semiconductor laser element 13 which emits laser light 4, a photodetector 10 which reflects most of the laser light 4 emitted from the semiconductor laser element 13 in the vertical direction of a stem 1 and receives part of the laser light 4, a submount 2 on which the semiconductor laser element 13 and the photodetector 10 are mounted, and the stem 1 on which the submount 2 is mounted. The submount 2 is disposed between the semiconductor laser element 13 and the stem 1, and the photodetector 10 and the stem 1. The stem 1 comprises a body part 14 to which the submount 2 is disposed and fixed, and a plurality of leads 15*a*, 15*b*, 15*c*, 15*d* fixed to the body part 14 via low-melting-point glass 44. FIG. 1 shows an example in which the submount 2 includes a first submount 11 and a second submount 12. The first submount 11 is disposed on the front face (stem front face 34) of the stem 1, and on a front face 31 of the first submount 11, a photodetector 10 is disposed and the semiconductor laser element 13 is disposed via the second submount 12.

In the photodetector 10, a light receiving face 17 for receiving the laser light 4 is formed on the side facing the semiconductor laser element 13, and a reflective film 20 in which part of the laser light 4 is transmitted and the rest is reflected is formed on the light receiving face 17. The reflective film 20 is, for example, a dielectric multilayer film such as SiN or SiO2, and the reflectivity of the reflective film 20 is set to, for example, about 90%. The range of reflectivity of the reflective film 20 is, for example, 85% to 95%. In this case, about 90% (85% to 95%) of the laser light 4 incident on the photodetector 10 is reflected in the vertical direction of the stem 1, and about 10% (15% to 5%) of the laser light 4 is received by the photodetector 10. The photodetector 10 receives the laser light 4 and outputs a detection current. When the reflectivity of the reflective film 20 is 85%, 85% of the laser light 4 incident on the photodetector 10 is reflected in the vertical direction of the stem 1, and 15% of the laser light 4 is received by the photodetector 10. When the reflectivity of the reflective film 20 is 95%, 95% of the laser light 4 incident on the photodetector 10 is reflected in the vertical direction of the stem 1, and 5% of the laser light 4 is received by the photodetector 10. Note that, in FIG. 1, an example is shown in which an optical axis 7 of output light 6 is perpendicular to the stem front face 34 of the stem 1, and the photodetector 10 is disposed to reflect the laser light 4 emitted from the semiconductor laser element 13 perpendicularly to the stem front face 34 of the stem 1. Here, the "perpendicularity" to the stem front face 34 of the stem 1 includes a tolerance considering an error.

The first submount 11 is, for example, a ceramic substrate, and the second submount 12 is, for example, a triangular prism ceramic substrate having a triangular cross section that is parallel to the optical axis 5 of the laser light 4 and perpendicular to the stem 1. The second submount 12 includes a bottom face 45 connected to the first submount 11, an opposing face 50 facing the photodetector 10, and an inclined face 46 on which the semiconductor laser element 13 is disposed. The inclined face 46 is an inclined portion of submount 2 inclined with respect to the stem front face 34 of the stem 1. The angle between the bottom face 45 and the inclined face 46 is an inclination angle θ. The angle between the optical axis 5 of the laser light 4 emitted from the semiconductor laser element 13 and a dashed line 47 parallel to the stem front face 34, which is the front face of the stem 1, is the inclination angle θ. By adjusting the inclination angle θ of the second submount 12, the laser light 4 can be emitted from the semiconductor laser element 13 at a freely-selected angle. The semiconductor laser element 13 is disposed on the inclined face 46, which is the inclined portion of the submount 2, and the photodetector 10 is disposed on the front face of the submount 2 except for the inclined portion, that is, on the front face 31 of the first submount 11. The angle of the inclined face 46 which is the inclined portion with respect to the bottom face 45 on the side to the stem 1 in the submount 2 is adjusted to an angle range in which the laser light 4 emitted from the semiconductor laser element 13 is received by the light receiving face 17 of the photodetector 10. Note that, the second submount 12 in the triangular prism shape may be referred to as the second submount 12 in a "wedge-shape".

The photodetector 10 of Embodiment 1 is a waveguide type light receiving element 8 in which the light receiving face 17 has an inclined face 18 inclined with respect to a bottom face 28. The waveguide type light receiving element 8 includes a semiconductor substrate 21 such as an n-type InP substrate, a first cladding layer 22 formed on the front face side of the semiconductor substrate 21, an absorption layer 23, a second cladding layer 24, an anode electrode 26, a cathode electrode 27 formed on the rear face side of the semiconductor substrate 21, and the reflective film 20 formed on the inclined face 18 which is the light receiving face 17. The absorption layer 23 absorbs the laser light 4 and extends on the side to the light receiving face 17. Note that, in FIG. 5, the reflective film 20 is omitted. The bottom face 28 described above is the rear face of the semiconductor substrate 21 or the rear face of the cathode electrode 27. Here, the bottom face 28 is defined to be the rear face of the semiconductor substrate 21. The angle between the bottom face 28 and the inclined face 18 is an inclination angle α. By adjusting the inclination angle θ of the second submount 12 and the inclination angle α of the waveguide type light receiving element 8, the semiconductor laser device 70 of Embodiment 1 can make the laser light 4 emitted from the semiconductor laser element 13 output the output light 6 along the optical axis perpendicular to the stem front face 34 of the stem 1.

When the photodetector 10 is operated, a reverse bias is applied between the anode electrode 26 and the cathode electrode 27 of the waveguide type light receiving element 8 which is the photodetector 10. Incident light on the photodetector 10 is absorbed by the absorption layer 23 to be converted into a current, and outputted to the outside of the photodetector 10 as a detection current.

The semiconductor laser device 13 includes a semiconductor substrate such as an n-type InP substrate, an active layer 35, an anode electrode 36, and a cathode electrode 37 formed on the rear face of the semiconductor substrate. When the semiconductor laser device 13 is operated, a forward bias is applied between the anode electrode 36 and the cathode electrode 37 of the semiconductor laser device 13. The current injected from the anode electrode 36 is converted into light in the active layer 35 to propagate through the active layer 35, and the laser light 4 is emitted from the emission end face facing the photodetector 10. The optical axis 5 of the laser light 4 is in the direction in which the active layer 35 extends. The semiconductor laser device 70 of Embodiment 1 is disposed on the side to the stem front face 34 between the stem front face 34 and a farthest portion 59 of the photodetector 10 farthest away from the stem front face 34 of the stem 1 on which the semiconductor laser element 13 and the photodetector 10 are mounted. The farthest portion 59 of the photodetector 10 is the front face away from the stem 1 in the photodetector 10. When the photodetector 10 is the waveguide type light receiving element 8, for example, the anode electrode 26 is the farthest portion 59.

The body part 14 of the stem 1 is, for example, a disk of steel plate cold commercial (SPCC), and through holes 43 into which the leads 15*a*, 15*b*, 15*c* and 15*d* are to be inserted is formed in the body part 14 of the stem 1. The leads 15*a*, 15*b*, 15*c*, and 15*d* are inserted into the through hole 43 and fixed to the body part 14 by the low-melting-point glass 44. The leads 15*a*, 15*b*, 15*c*, and 15*d* are, for example, made of alloy of Ni—Fe. A conductor 32 is formed on the front face 31 of the first submount 11, and a conductor 33 is formed on the inclined face 46 on the front face side of the second submount 12. The front face 31 of the first submount 11 is opposite side to the stem 1 and is on the side on which the photodetector 10 is disposed, that is, a disposed side. The front face side of the second submount 12 is opposite side to the stem 1 and is the side on which the semiconductor laser element 13 is disposed, that is, a disposed side. In the first submount 11, the bottom face 29 on the rear face side is fixed to the stem front face 34 which is the front face of the stem 1 by an adhesive or the like, and in the second submount 12, the bottom face 45 being the rear face side is fixed to the front face 31 of the first submount 11 by an adhesive or the like.

The photodetector 10 is fixed to the conductor 32 of the first submount 11 by solder or other brazing material, and the semiconductor laser element 13 is fixed to the conductor 33 of the second submount 12 by solder or other brazing material. The lead 15*d* and the conductor 32 of the first submount 11 are connected by a wire 16 made of gold or the like, and the lead 15*c* and the anode electrode 26 of the photodetector 10 are connected by the wire 16 made of gold or the like. The lead 15*b* and the conductor 33 of the second submount 12 are connected by the wire 16 made of gold or the like, and the anode electrode 36 of the semiconductor laser element 13 and the lead 15*a* are connected by the wire 16 made of gold or the like.

An example of a setting for the inclination angle θ of the second submount 12 and the inclination angle α of the photodetector 10 will be described. The light receiving face 17 of the photodetector 10 faces the semiconductor laser element 13. The inclined face 18 of the waveguide type light receiving element 8 serving as the photodetector 10 can be formed by dry etching or wet etching. In the case where the wet etching is used, the inclined face 18 is formed before the formation of the anode electrode 26 and the cathode electrode 27. In the case where the dry etching is used, the inclined face 18 may be formed either before or after the formation of the anode electrode 26 and the cathode electrode 27. By using the dry etching, the inclination angle α of the waveguide type light receiving element 8 can be set to a freely-selected angle. When the dry etching is used, the chip of the waveguide type light receiving element 8 is obliquely fixed by a jig, and the inclination angle α of the inclined face 18 is finely adjusted.

In contrast, when the wet etching is used, the inclination angle α is determined depending on the relationship between chemical solution to be used and crystal plane orientation of the semiconductor substrate 21, the first cladding layer 22 that is epitaxially grown, the absorption layer 23, and the second cladding layer 24. Accordingly when the wet etching is used, an advantage is that an accurate inclination angle α can be formed without the fine adjustment of the inclination angle α of the inclined face 18. When the inclination angle α of the inclined face 18 is used, if the inclination angle θ of the second submount 12 is $90°-2\times(90°-\alpha)$, the output light 6 is emitted along the optical axis 7 in the vertically upward direction with respect to the stem front face 34 of the stem 1. For example, when InP is etched with HBr chemical solution, the (111) plane is exposed, and the plane angle is about 55°, that is, 55° on average. When the semiconductor substrate 21 is an InP substrate and the first cladding layer 22, the absorption layer 23, and the second cladding layer 24 are InP-based materials, the inclination angle $\alpha$ of the inclined face 18 constituted by the semiconductor substrate 21, the first cladding layer 22, the absorption layer 23, and the second cladding layer 24 can be set to about 55°. Therefore, if the inclination angle $\theta$ of the second submount 12 is set to 20°, the output light 6 can be emitted in the vertically upward direction with respect to the stem front face 34 of the stem 1.

Note that, when the inclined face 18 of the waveguide type light receiving element 8 is formed by the dry etching, if the inclination angle $\theta$ of the second submount 12 is $90°-2\times(90°-\alpha)$, the output light 6 is emitted along the optical axis 7 in the vertically upward direction with respect to the stem front face 34 of the stem 1.

In the semiconductor laser device 70 of Embodiment 1, the semiconductor laser element 13 and the photodetector 10 are separated, and the degree of freedom in arranging the semiconductor laser element 13 and the photodetector 10 is high. Therefore, unlike the surface-emitting semiconductor laser with the monitor in Patent Document 1 in which the laser part and the photodetector part are monolithically integrated, even in the case where the laser light 4 emitted from the laser element 13 spreads out, the laser light 4 emitted from the semiconductor laser element 13 can be reflected even up to the tail of the laser light 4 by the light receiving face 17 of the photodetector 10.

In the surface-emitting semiconductor laser with the monitor of Patent Document 1, it is necessary to vertically form a separation groove (rectangular parallelepiped groove) once between the laser part and the photodetector part, and then to form an inclined groove having an inclined face only at the end face of the photodetector part in the photodetector part of Patent Document 1, the length in the light propagation direction is smaller than that of the laser part, and further, the maximum length in the light propagation direction in the inclined groove is shorter than the minimum length of the photodetector part which is the length of the uppermost portion of the photodetector part, so that it is extremely difficult to make the inclination angle, which is the angle between the substrate and the inclined face, constant. That is, it is very difficult to fabricate the separation groove including the rectangular parallelepiped groove and the inclined groove disclosed in Patent Document 1. Further, since the laser light emission end face of the laser part is formed by the dry etching, the laser light emission end face is rough compared with the cleaved face, and scattering at the laser light emission end face increases, so that the laser light spreads out. Therefore, in the surface-emitting semiconductor laser with the monitor in Patent Document 1 in which the front face of each layer in the laser part and the photodetector part is the same, the laser light spread out on the side to the positive electrode formed on the front face side cannot be reflected depending on the conditions of use in the laser part. Further, in the surface-emitting semiconductor laser with the monitor in Patent Document 1, when a physical defect analysis is performed, since the separation groove exists between the laser part and the photodetector part, it is difficult to observe the laser light emission end face of the laser part and the light receiving end face of the photodetector part facing thereto with an optical microscope and an electron microscope.

In contrast, in the semiconductor laser device 70 of Embodiment 1, since the semiconductor laser element 13 and the photodetector 10 are separated from each other, unlike the surface-emitting semiconductor laser with the monitor in Patent Document 1 which cannot be optimized independently it is possible to optimize independently the formation of the laser light emission end face of the semiconductor laser element 13 for emitting the laser light by processing and the formation of the light receiving face 17 of the photodetector 10 by processing. Further, in the semiconductor laser device 70 of Embodiment 1, since the semiconductor laser element 13 and the photodetector 10 are separated from each other, the laser light emission end face of the semiconductor laser element 13 for emitting the laser light can be formed by cleaving. Therefore, the semiconductor laser device 70 of Embodiment 1 is different from the surface-emitting semiconductor laser with the monitor in Patent Document 1 having the laser light emission end face by the dry etching in that the laser light emission end face is smooth, scattering on the laser light emission end face is reduced, and the spread of the laser light can be suppressed. In the semiconductor laser device 70 according to Embodiment 1, since the semiconductor laser element 13 and the photodetector 10 are separated from each other, unlike the surface-emitting semiconductor laser with the monitor in Patent Document 1, the semiconductor laser element 13 and the photodetector 10 can be independently subjected to physical defect analysis, and in particular, the laser light emission end face of the semiconductor laser element 13 and the light receiving face 17 of the photodetector 10 can be easily observed with an optical microscope and an electron microscope.

In the surface-emitting semiconductor laser with the monitor in Patent Document 1, the laser part and the photodetector part are monolithically integrated, and the manufacturing process is longer than that of a single product, so that the production yield is low. Further, when one of the laser part and the photodetector part is defective in the product inspection, both the laser part and the photodetector part are discarded, so that the production yield is lowered and the cost per product is increased.

In contrast, in the semiconductor laser device 70 of Embodiment 1, since the semiconductor laser element 13 and the photodetector 10 are separated from each other, the manufacturing process of the semiconductor laser element 13 and the manufacturing process of the photodetector 10 are independent from each other, and the manufacturing process can be made shorter than that of the surface-emitting semiconductor laser with the monitor in Patent Document 1, and the production yield can be increased along with the shortening of the manufacturing process. Further, in the semiconductor laser device 70 of Embodiment 1, since the semiconductor laser element 13 and the photodetector 10 are separated from each other, the semiconductor laser element 13 and the photodetector 10 can be individually inspected, the overall yield of the semiconductor laser element 13 and the photodetector 10 can be higher than that of the surface-emitting semiconductor laser with the monitor in Patent Document 1, and the disposal of defective products can be reduced.

A semiconductor laser device used for optical communication or the like controls emission and non-emission of laser light at high frequency that is, it modulates laser light. In order to meet the demand for the speedup of optical communication, a semiconductor laser device that modulates laser light at a high speed is required. FIG. 6 and FIG. 7 show an example of a semiconductor laser device provided with a semiconductor laser capable of modulating laser light at a high speed without using a modulator. The semiconductor laser device 90 of the comparative example shown in FIG. 6 and FIG. 7 emits laser light in the vertically upward direction with respect to the front face of the stem 91, similarly to the semiconductor laser device 70 of Embodiment 1. The semiconductor laser device 90 of the comparative example includes a semiconductor laser element 85, a submount 83 on which the semiconductor laser element 85 is mounted, a mounting substrate 80 on which the submount 83 is mounted, a photodetector 87 for detecting the laser light of the semiconductor laser element 85, a submount 86 on which the photodetector 87 is mounted, a block 84 for supporting the mounting substrate 80, and a stem 91 on which the mounting substrate 80 and the block 84 and the submount 86 are mounted.

The stem 91 includes a body part 88 to which the mounting substrate 80, the block 84 and the submount 86 are fixed, and a plurality of leads 89*a*, 89*b*, 89*c* and 89*d* fixed to the body part 88 through the low-melting-point glass 44. The submount 83 is a ceramic substrate having conductors 82*a* and 82*b*. The mounting substrate 80 is a ceramic substrate having conductors 81*a* and 81*b*. The submount 86 is a ceramic substrate having a conductor 92. The cathode electrode formed on the rear face side of the semiconductor laser element 85 is fixed to the conductor 82*a* on the submount 83 by a brazing material such as solder, and the cathode electrode formed on the rear face side of the photodetector 87 is fixed to the conductor 92 on the submount 86 by a brazing material such as solder. The submount 83 is fixed to the mounting substrate 80 by an adhesive or the like. The submount 86 is fixed to the front face of the stem 91 by an adhesive or the like.

The anode electrode formed on the front face side (opposite side to the rear face side) of the semiconductor laser element 85 and the conductor 82*b* are connected by the wire 16 made of gold or the like, the conductor 82*b* and the conductor 81*b* are connected by the wire 16 made of gold or the like, and the conductor 82*a* connected to the cathode electrode of the semiconductor laser element 85 and the conductor 81*a* are connected by the wire 16 made of gold or the like. The mounting substrate 80 is fixed to the side face of the block 84 by an adhesive or the like. The conductors 81*a* and 81*b* of the mounting substrate 80 fixed to the block 84 are connected to the leads 89*b* and 89*a*, respectively, by a brazing material such as solder, and the bottom face (face facing the stem 91) of the block 84 is fixed to the front face of the stem 91 by an adhesive or the like. First, the bottom face of the block 84 and the front face of the stem 91 are fixed while the conductors 81*a* and 81*b* of the mounting substrate 80 are brought into contact with the leads 89*b* and 89*a*. Thereafter, the conductors 81*a* and 81*b* of the mounting substrate 80 are connected to the leads 89*b* and 89*a* by a brazing material such as solder. The anode electrode formed on the front face side (opposite side to the rear face side) of the photodetector 87 and the lead 89*c* are connected by the wire 16 made of gold or the like, and the conductor 92 to which the cathode electrode of the photodetector 87 is connected and the lead 89*d* are connected by the wire 16 made of gold or the like.

Since the semiconductor laser device 90 of the comparative example emits light in the vertically upward direction with respect to the front face of the stem 91, the semiconductor laser element 85 is disposed at a position apart from the stem 91, and the laser light is emitted as output light in the vertically upward direction of the stem 91. The photodetector 87 for monitoring the laser light output of the semiconductor laser element 85 is disposed closer to the stem 91 than the semiconductor laser element 85, and the photodetector 87 detects the laser light emitted from the rear end face side of the semiconductor laser element 85 which is the side facing the stem 91. As described above, in the semiconductor laser device 90 of the comparative example, since the semiconductor laser element 85 is fixed through the submount 83 to the mounting substrate 80 and the block 84 that are on the stem 91, and since the emission end face for the output light output to the outside by the semiconductor laser element 85 faces the vertically upward direction of the stem 91, the output light output from the semiconductor laser element 85 to the outside is emitted in the vertical direction with respect to the front face of the stem 91. In the semiconductor laser device 90 of the comparative example, since the distance from the front face of the stem 91 to the semiconductor laser element 85 is long, a connecting member for connecting the leads 89*a* and 89*b* to the anode electrode and the cathode electrode of the semiconductor laser element 85 includes the wire 16 that is long and conductors 81*a* and 81*b* that are long. Since the long wire 16, the long conductors 81*a* and 81*b*, and the leads 89*a* and 89*b* include parasitic inductance, the modulation characteristic in the semiconductor laser device 90 of the comparative example deteriorates owing to the influence the inductance.

Here, deterioration of the modulation characteristic will be specifically described. A modulation signal for operating the semiconductor laser element 85 is input to the anode electrode of the semiconductor laser element 85 via the lead 89*a*, the conductor 81*b* of the mounting substrate 80, the wire 16, the conductor 82*b* of the submount 83, and the wire 16. The laser light emitted from the semiconductor laser element 85 turns on and off following the on and off of the input modulation signal; that is, the laser light changes into an emitting state and a non-emitting state. However, even if the modulation signal is an ideal rectangular wave, the output waveform of the laser light emitted from the semiconductor laser element 85 is not a rectangular wave but is distorted. This is because impedance mismatching occurs owing to the influence of the parasitic inductance included in the long wire 16, the long conductors 81*a* and 81*b*, and the leads 89*a* and 89*b*, and the rise time and fall time of the modulated light waveform which is the output waveform from the semiconductor laser element 85 take finite values. When the distortion of the modulated light waveform is large, it becomes impossible to determine an on-judgement and an off-judgement of the laser light at the receiving side. Especially in the case of high-speed modulation, the influence of impedance mismatching becomes large, and the modulated light waveform is greatly distorted.

In order to improve the distortion of the modulated light waveform, the length of the wire 16, the conductors 81*a* and 81*b*, and the leads 89*a* and 89*b* may be made as short as possible to reduce the parasitic inductance. However, in the structure of the comparative example shown in FIG. 6 and FIG. 7, it is necessary to extend the path including the wire 16, the conductors 81*a* and 81*b*, and the leads 89*a* and 89*b* to the semiconductor laser element 85 disposed away from the front face of the stem 91. Therefore, in the semiconductor laser device 90 of the comparative example, the length of the wire 16, the conductors 81*a* and 81*b*, and the leads 89*a* and 89*b* cannot be shortened, and deterioration of the modulated light waveform becomes a problem. By shortening the distance from the front face of the stem 91 to the semiconductor laser element 85, the conductors 81*a* and 81*b* and the leads 89*a* and 89*b* can be shortened. However, in the case where a typical assembly equipment for a semiconductor laser device is used, the chip suction collet and the stem 91 interfere with each other during chip mounting (chip fixing) of the semiconductor laser device 85, and thus it is difficult to shorten the distance from the front face of the stem 91 to the semiconductor laser device 85. Therefore, in the semiconductor laser device 90 of the comparative example shown in. FIG. 6 and FIG. 7, a high-frequency substrate is used as the mounting substrate 80 in order to suppress the deterioration of the modulated light waveform. However, since the unit price of the high-frequency substrate is high and the cost of the semiconductor laser device 90 is increased, it is desirable to eliminate the mounting substrate 80, which is the high-frequency substrate, when considering the cost.

The semiconductor laser device 70 of Embodiment 1 includes the semiconductor laser element 13 disposed near the stem front face 34 of the stem 1 and the photodetector 10 having the light receiving face 17 facing the emission end face of the semiconductor laser element 13 that emits the laser light, and thus the distance of the semiconductor laser element 13 from the stem front face 34 of the stem 1 can be made shorter than that of the semiconductor laser device 90 of the comparative example, so that the lead 15*a* and the wire 16 connected to the anode electrode 26 of the semiconductor laser element 13 can be made shorter, and the deterioration of the modulated light waveform of the semiconductor laser element 13 can be suppressed. That is, the semiconductor laser device 70 of Embodiment 1 can improve the modulation characteristic. Further, the semiconductor laser device 70 of Embodiment 1 is different from the semiconductor laser device 90 of the comparative example in that the high-frequency substrate for suppressing the deterioration of the modulation characteristic can be eliminated, so that the cost can be reduced as compared with the semiconductor laser device 90 of the comparative example.

As described above, the semiconductor laser device 70 of Embodiment 1 includes the semiconductor laser element 13, the photodetector 10 for receiving the laser light 4 emitted from the semiconductor laser element 13, and the stem 1 on which the semiconductor laser element 13 and the photodetector 10 are mounted. The semiconductor laser element 13 is disposed on the side to the stem front face 34 between the stem front face 34 and the farthest portion 59 of the photodetector 10 farthest away from the stem front face 34 of the stem 1 on which the semiconductor laser element 13 and the photodetector 10 are mounted. In the photodetector 10, the light receiving face 17 for receiving the laser light 4 is formed on the side facing the semiconductor laser element 13, and the reflective film 20 in which part of the laser light 4 is transmitted and the rest is reflected is formed on the light receiving face 17. With this configuration, the semiconductor laser device 70 of Embodiment 1 is disposed on the side to the stem front face 34 between the stem front face 34 and the farthest portion 59 of the photodetector 10 farthest away from the stem front face 34, and the reflective film 20 in which part of the laser light 4 is transmitted and the rest is reflected is formed on the light receiving face 17 of the photodetector 10 that receives the laser light 4, the light receiving face 17 being formed on the side facing the semiconductor laser element 13. Therefore, even in the case where the laser light 4 emitted from the semiconductor laser element 13 spreads out, the laser light 4 can be reflected by the light receiving face 17 of the photodetector 10 even up to the tail of the laser light 4.

Embodiment 2

Figure 8:
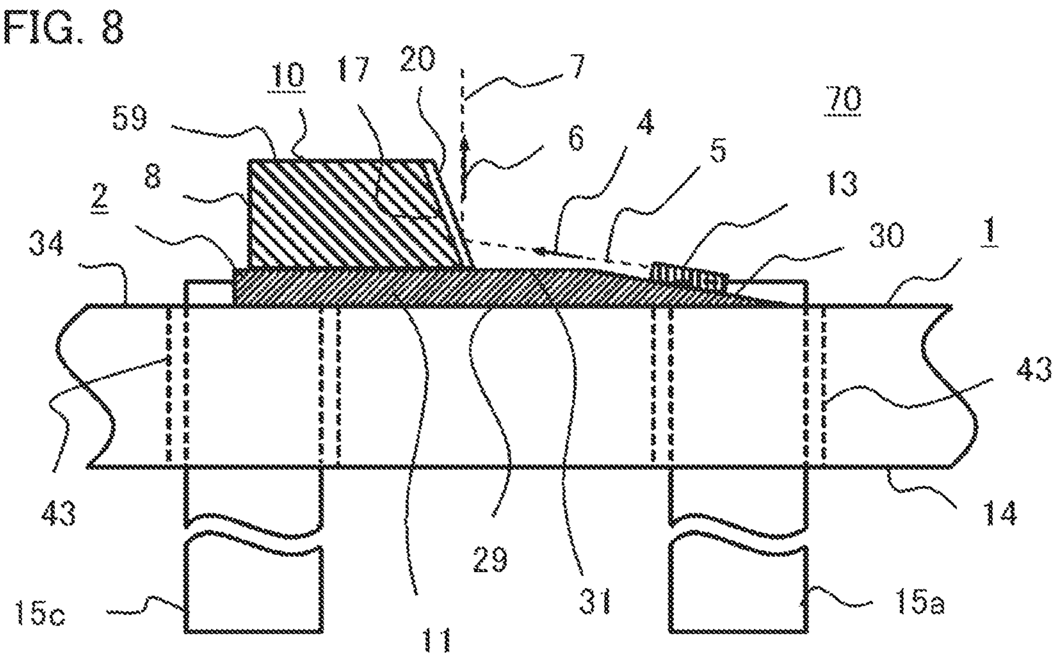
FIG. 8 is a cross-sectional view showing a semiconductor laser device according to Embodiment 2.
Figure 9:
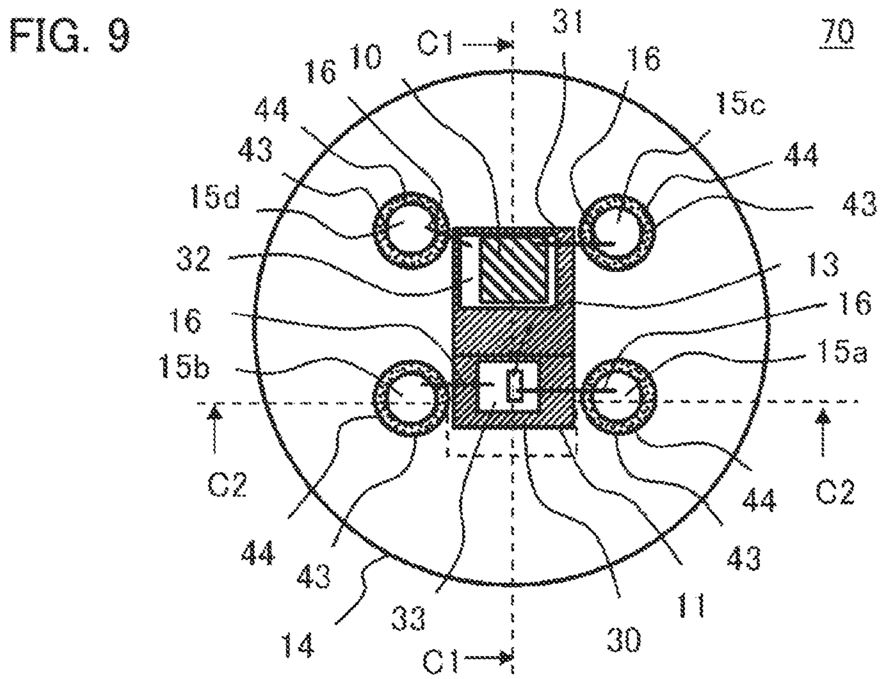
FIG. 9 is a plan view showing the semiconductor laser device according to Embodiment 2.
Figure 10:
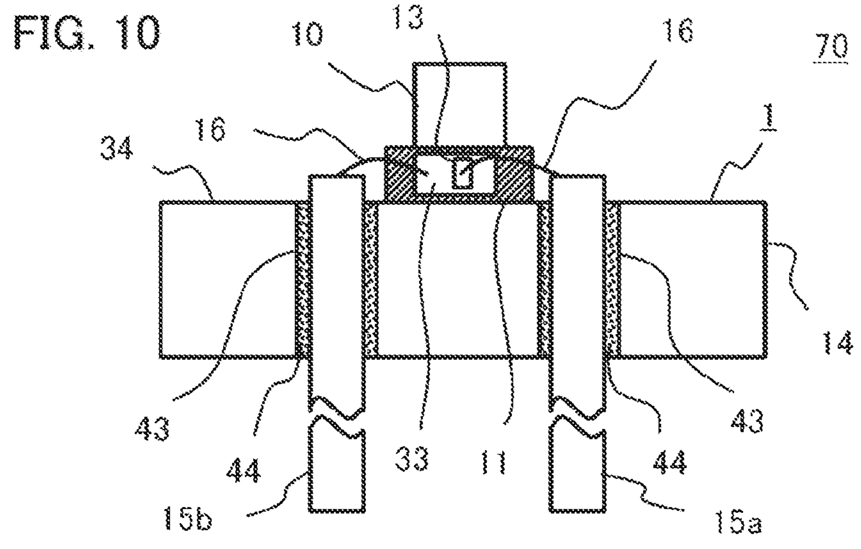
FIG. 10 is a cross-sectional view taken along the dashed line C2-C2 in FIG. 9.
Figure 11:
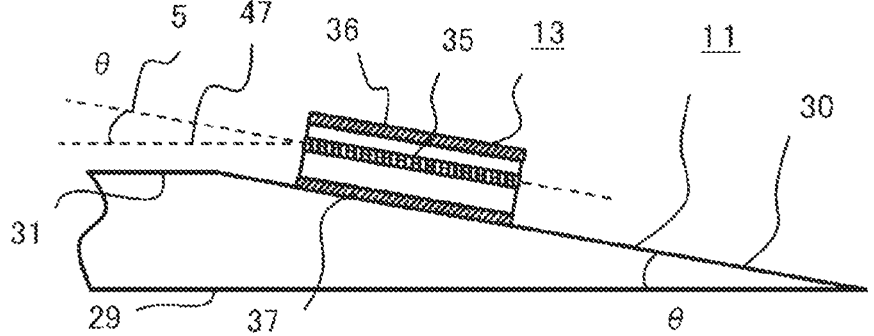
FIG. 11 is a diagram for illustrating an inclination angle of a first submount of FIG. 8.

FIG. 8 is a cross-sectional view showing a semiconductor laser device according to Embodiment 2, and FIG. 9 is a plan view showing the semiconductor laser device according to Embodiment 2. FIG. 10 is a cross-sectional view taken along the dashed line C2-C2 in FIG. 9, and FIG. 11 is a diagram for illustrating an inclination angle of the first submount of FIG. 8. FIG. 8 is the cross-sectional view taken along the dashed line C1-C1 in FIG. 9. The semiconductor laser device 70 of Embodiment 2 is different from the semiconductor laser device 70 of Embodiment 1 in that the semiconductor laser device 70 of Embodiment 2 includes a submount 2 constituted by a single first submount 11 having an inclined face 30. A part different from the semiconductor laser device 70 of Embodiment 1 will be mainly described.

The first submount 11 constituting the submount 2 of Embodiment 2 includes a bottom face 29 connected to the stem 1, the front face 31 on which the photodetector 10 is disposed, and the inclined face 30 on which the semiconductor laser element 13 is disposed. The inclined face 30 is an inclined portion of the submount 2 inclined with respect to the stem front face 34 of the stem 1. The angle between the bottom face 29 and the inclined face 30 is the inclination angle θ. The angle between the optical axis 5 of the laser light 4 emitted from the semiconductor laser element 13 and the dashed line 47 parallel to the stem front face 34 which is the front face of the stem 1 is the inclination angle θ. By adjusting the inclination angle θ of the first submount 11, the laser light 4 can be emitted from the semiconductor laser element 13 at a freely-selected angle. The semiconductor laser element 13 is disposed on the inclined face 30 which is the inclined portion of the submount 2, and the photodetector 10 is disposed on the front face of the submount 2 except for the inclined portion, that is, on the front face 31 of the first submount 11. The angle of the inclined face 30, which is the inclined portion with respect to the bottom face 29 on the side to the stem 1 in the submount 2, is adjusted to an angle range in which the laser light 4 emitted from the semiconductor laser element 13 is received by the light receiving face 17 of the photodetector 10. Further, by adjusting the inclination angle θ of the first submount 11 and the inclination angle α of the waveguide type light receiving element 8, the semiconductor laser device 70 of Embodiment 2 can make the laser light 4 emitted from the semiconductor laser element 13 output the output light 6 along the optical axis 7 perpendicular to the stem front face 34 of the stem 1, similarly to the semiconductor laser device 70 of Embodiment 1.

An example of the setting for the inclination angle θ of the first submount 11 and the inclination angle α of the photodetector 10 is the same as that of the semiconductor laser device 70 of Embodiment 1. When the inclination angle α of the photodetector 10 is set to about 55° and the inclination angle θ of the first submount 11 is set to 20°, the output light 6 can be emitted in the vertically upward direction with respect to the stem front face 34 of the stem 1. In the semiconductor laser device 70 of Embodiment 2, similarly to the semiconductor laser device 70 of Embodiment 1, even in the case where the laser light 4 emitted from the semiconductor laser element 13, which is the semiconductor laser, spreads out, the laser light 4 can be reflected by the light receiving face 17 of the photodetector 10 even up to the tail of the laser light 4. The semiconductor laser device 70 of Embodiment 2 has the same configuration as that of the semiconductor laser device 70 of Embodiment 1 except that the submount 2 is constituted by the single first submount 11 having the inclined face 30, and thus the semiconductor laser device 70 of Embodiment 2 has the same effect as that of the semiconductor laser device 70 of Embodiment 1.

Embodiment 3

Figure 12:
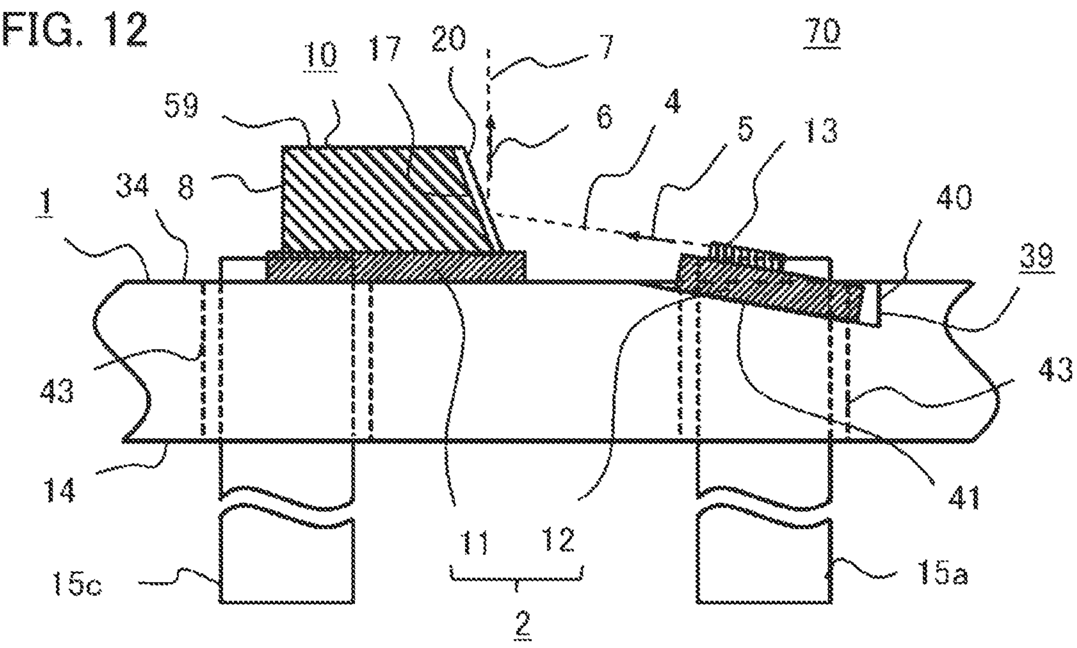
FIG. 12 is a cross-sectional view showing a semiconductor laser device according to Embodiment 3.
Figure 13:
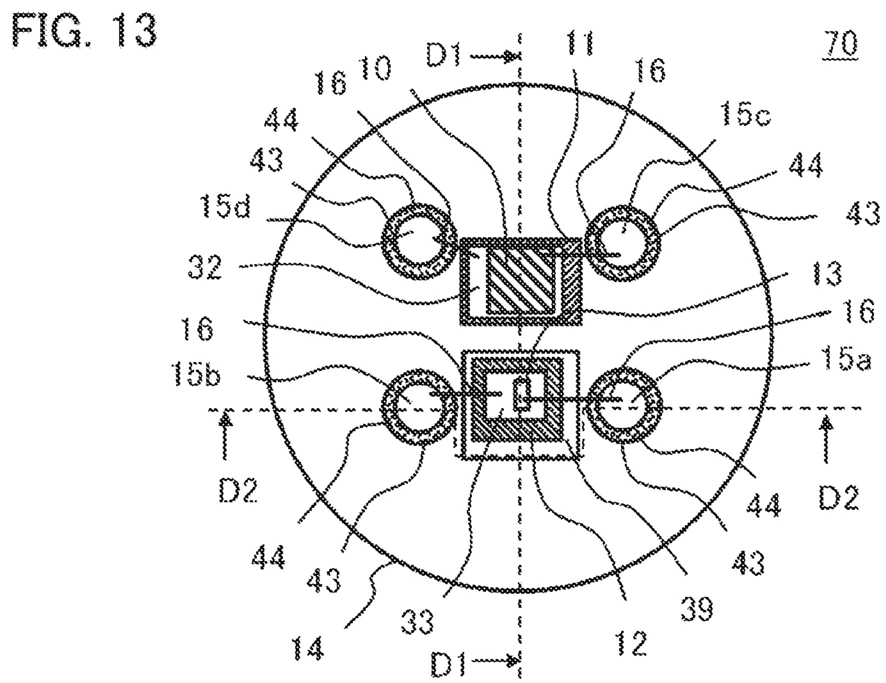
FIG. 13 is a plan view showing the semiconductor laser device according to Embodiment 3.
Figure 14:
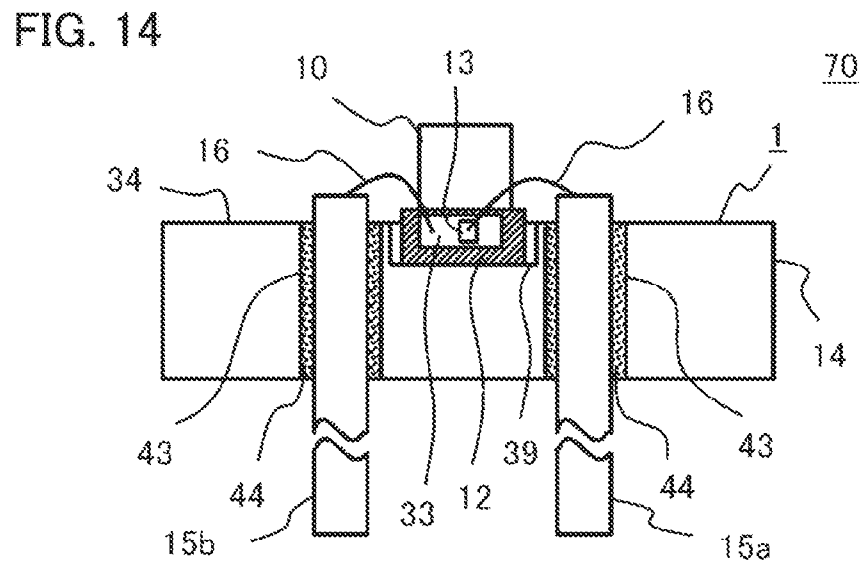
FIG. 14 is a cross-sectional view taken along the dashed line D2-D2 in FIG. 13.
Figure 15:
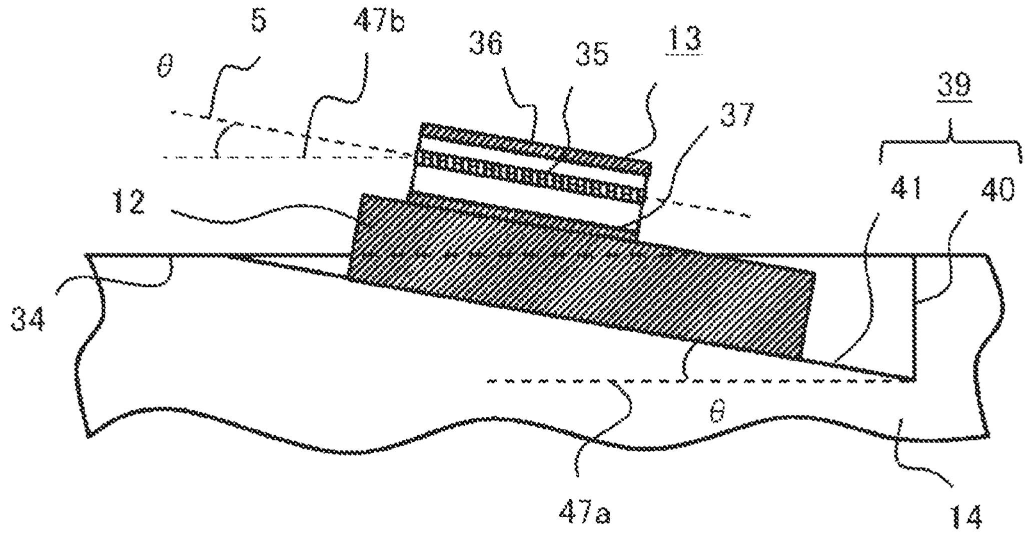
FIG. 15 is a diagram for illustrating a groove of a stem of FIG. 12.

FIG. 12 is a cross-sectional view showing a semiconductor laser device according to Embodiment 3, and FIG. 13 is a plan view showing the semiconductor laser device according to Embodiment 3. FIG. 14 is a cross-sectional view taken along the dashed line D2-D2 in FIG. 13, and FIG. 15 is a diagram for illustrating a groove of a stem of FIG. 12. FIG. 12 is the cross-sectional view taken along the dashed line D1-D1 in FIG. 13. The semiconductor laser device 70 of Embodiment 3 is different from the semiconductor laser device 70 of Embodiment 1 in that a groove 39 having an inclined face 41 and a side face 40 is formed in the stem 1, and the submount 2 is constituted by the first submount 11 for disposing the photodetector 10 and the second submount 12 for disposing the semiconductor laser element 13. The stem 1 includes the groove 39 having the inclined face 41, and the semiconductor laser element 13 is disposed on the inclined face 41 of the groove 39 of the stem 1 via the submount 2. Apart different from the semiconductor laser device 70 of Embodiment 1 will be mainly described.

The first submount 11 constituting the submount 2 of Embodiment 3 has a sufficient area for the photodetector 10 to be disposed and has a shape not extending up to the groove 39 formed in the stem 1. The second submount 12 constituting the submount 2 of Embodiment 3 has a sufficient area for the semiconductor laser element 13 to be disposed and has a plate-like shape having a rear face and a front face that are parallel to the inclined face 41 of the groove 39. Note that the first submount 11 and the second submount 12 may be connected and integrated. The rear face of the second submount 12 is a face facing the inclined face 41, and the front face of the second submount 12 is a face opposite side to the rear face. The angle between the inclined face 41 of the groove 39 and the dashed line 47*a* parallel to the stem front face 34 of the stem 1 is the inclination angle θ. The angle between the optical axis 5 of the laser light 4 emitted from the semiconductor laser element 13 and the dashed line 47*b* parallel to the stem front face 34 which is the front face of the stem 1 is the inclination angle θ. By adjusting the inclination angle θ of the groove 39 formed in the stem 1, the laser light 4 can be emitted from the semiconductor laser element 13 at a freely-selected angle. The angle of the inclined face 41 with respect to the stem front face 34 of the submount 2 is adjusted to an angle range in which the laser light 4 emitted from the semiconductor laser element 13 is received by the light receiving face 17 of the photodetector 10. By adjusting the inclination angle θ of the groove 39 formed in the stem 1 and the inclination angle α of the waveguide type light receiving element 8, the semiconductor laser device 70 of Embodiment 3 can make the laser light 4 emitted from the semiconductor laser element 13 output the output light 6 along the optical axis 7 perpendicular to the stem front face 34 of the stem 1, similarly to the semiconductor laser device 70 of Embodiment 1.

An example of the setting for the inclination angle θ of the groove 39 formed in the stem 1 and the inclination angle α of the photodetector 10 are the same as that of the semiconductor laser device 70 of Embodiment 1. When the inclination angle α of the photodetector 10 is set to about 55° and the inclination angle θ of the groove 39 formed in the stem 1 is set to 20°, the output light 6 can be emitted in the vertically upward direction with respect to the stem front face 34 of the stem 1. In the semiconductor laser device 70 of Embodiment 3, similarly to the semiconductor laser device 70 of Embodiment 1, even in the case where the laser light 4 emitted from the semiconductor laser element 13, which is the semiconductor laser, spreads out, the laser light 4 can be reflected by the light receiving face 17 of the photodetector 10 even up to the tail of the laser light 4. The semiconductor laser device 70 of Embodiment 3 has the same configuration as the semiconductor laser device 70 of Embodiment 1 except that the groove 39 is formed in the stem 1 and the submount 2 is constituted by the first submount 11 for disposing the photodetector 10 and the second submount 12 for disposing the semiconductor laser element 13, and thus the semiconductor laser device 70 of Embodiment 3 has the same effect as the semiconductor laser device 70 of Embodiment 1. Note that, FIG. 12 and FIG. 15 show an example in which the semiconductor laser element 13 is disposed on the side to the stem front face 34 between the stem front face 34 and the farthest portion 59 of the photodetector 10 farthest away from the stem front face 34. However, the semiconductor laser element 13 disposed on the inclined face 41 of the groove 39 of the stem 1 via the second submount 12 may be disposed so as to be inside the groove 39 below the stem front face 34; that is, it may be disposed closer to the inclined face 41 than the stem front face 34.

Embodiment 4

Figure 16:
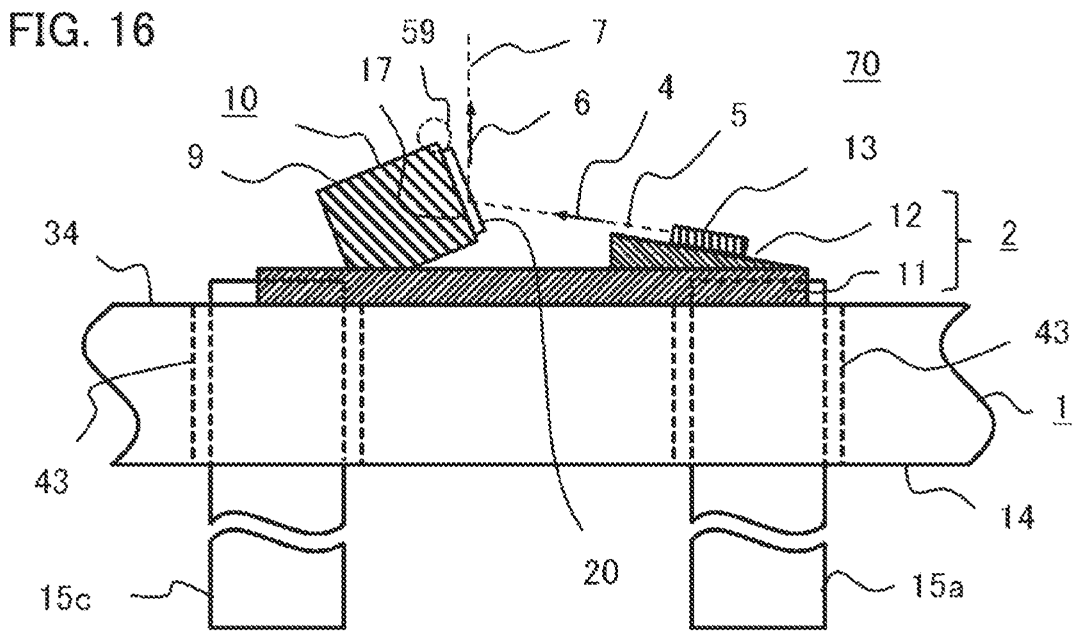
FIG. 16 is a cross-sectional view showing a semiconductor laser device according to Embodiment 4.
Figure 17:
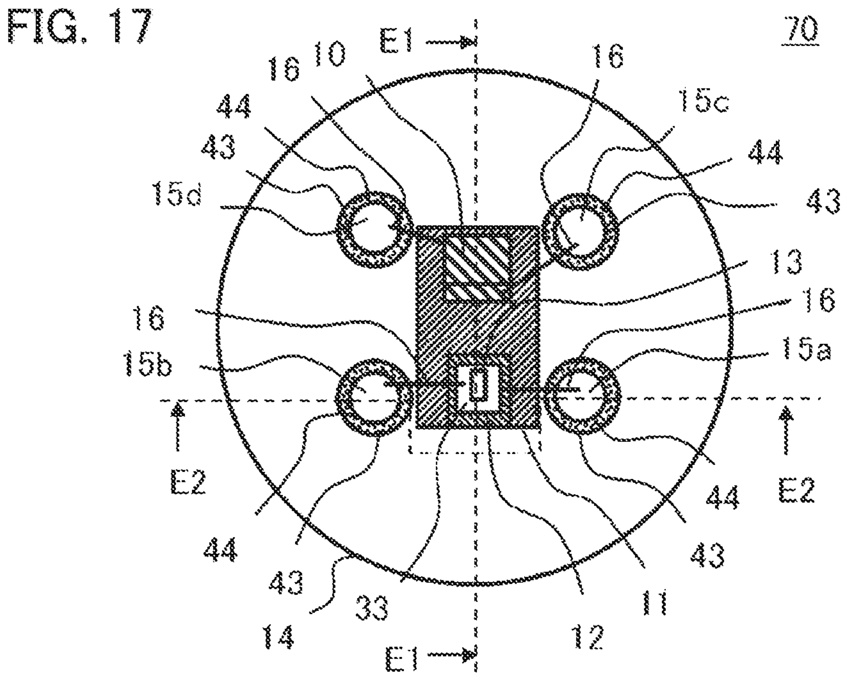
FIG. 17 is a plan view showing the semiconductor laser device according to Embodiment 4.
Figure 18:
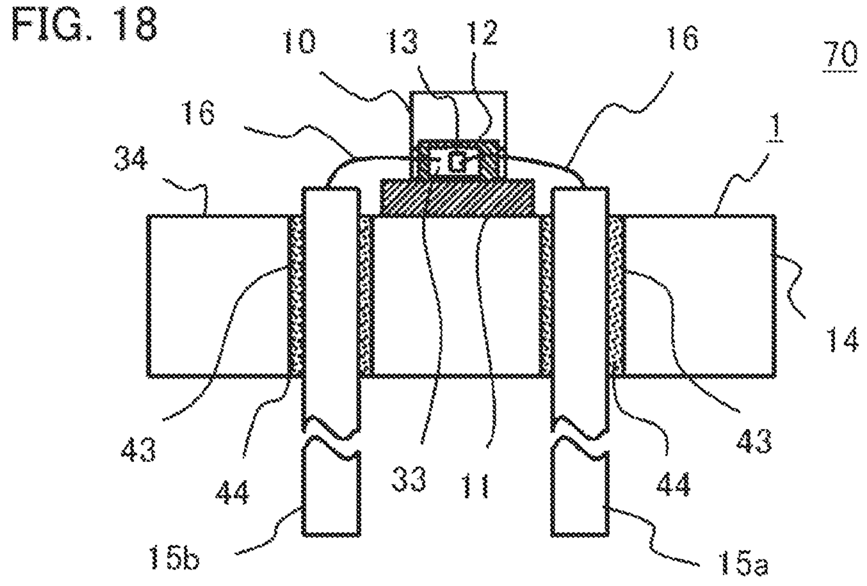
FIG. 18 is a cross-sectional view taken along the dashed line E2-E2 in FIG. 17.
Figure 19:
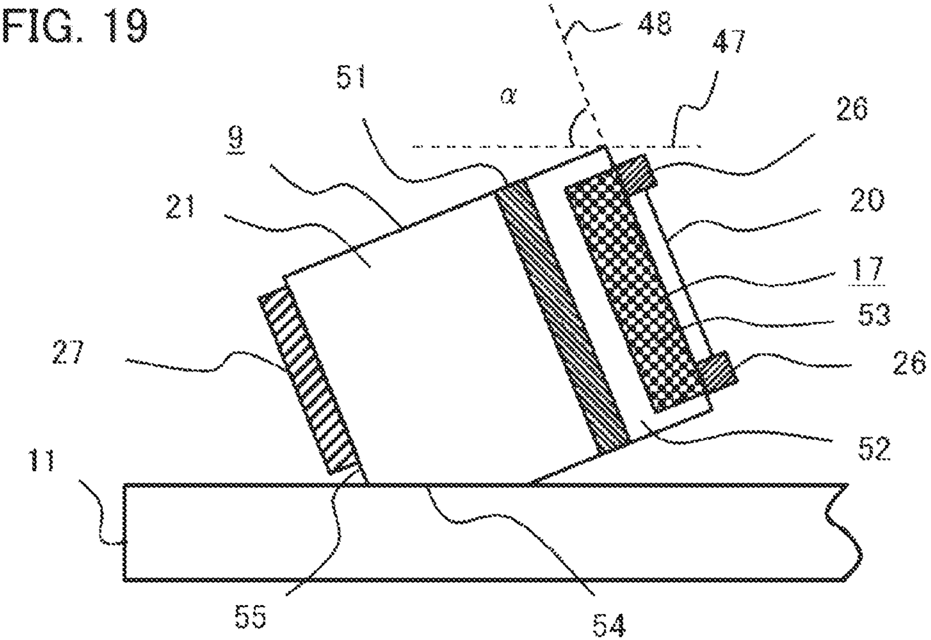
FIG. 19 is a diagram for illustrating an inclination angle of a planar light receiving element of FIG. 16.
Figure 20:
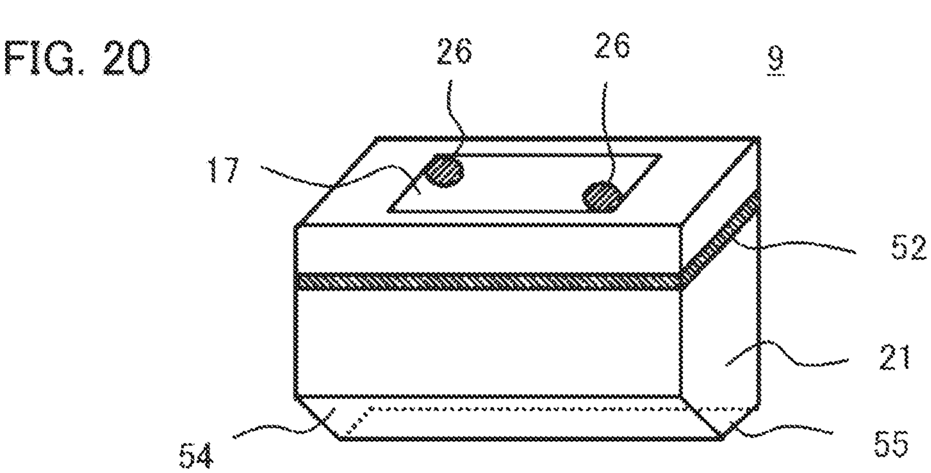
FIG. 20 is a perspective view of the planar light receiving element of FIG. 16.
Figure 21:
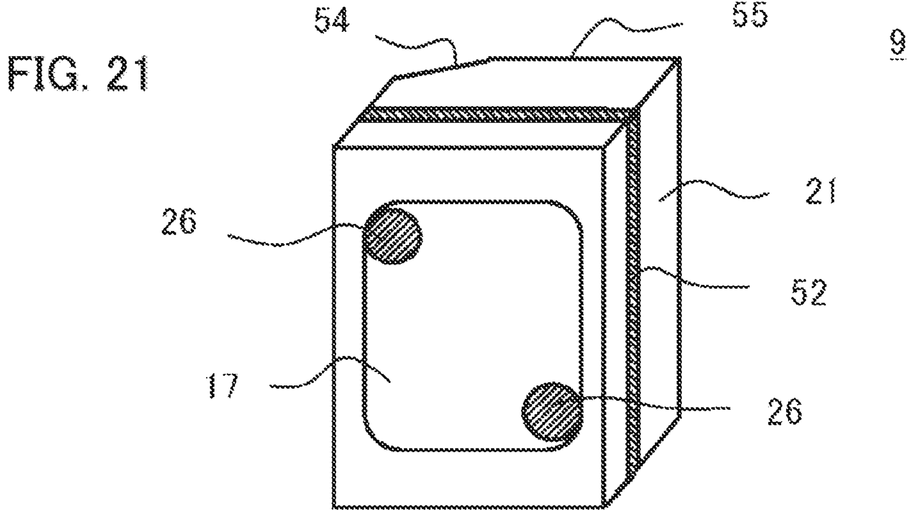
FIG. 21 is a perspective view of the planar light receiving element of FIG. 16.
Figure 22:
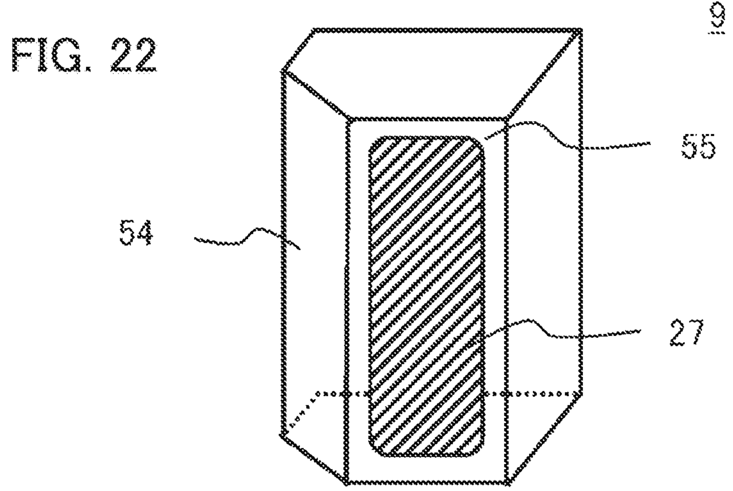
FIG. 22 is a perspective view of the planar light receiving element of FIG. 16.
Figure 23:
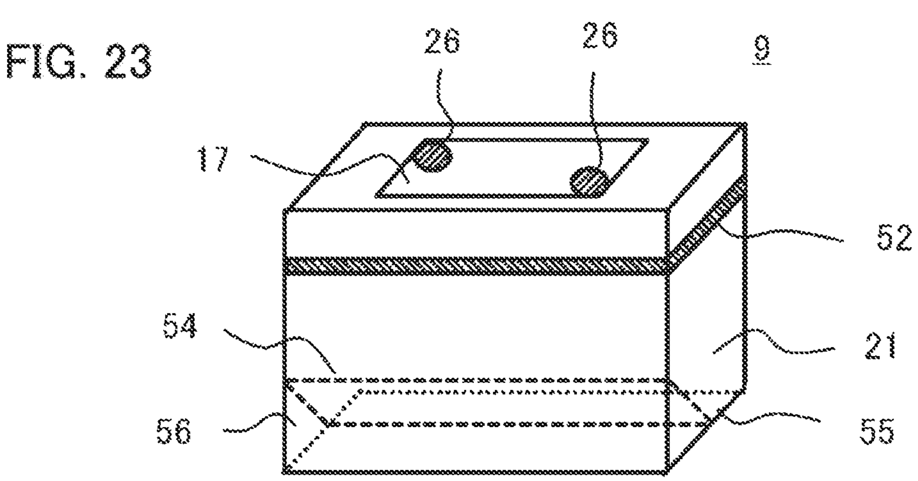
FIG. 23 is a perspective view showing a planar light receiving element before forming a processed face according to Embodiment 4.
Figure 24:
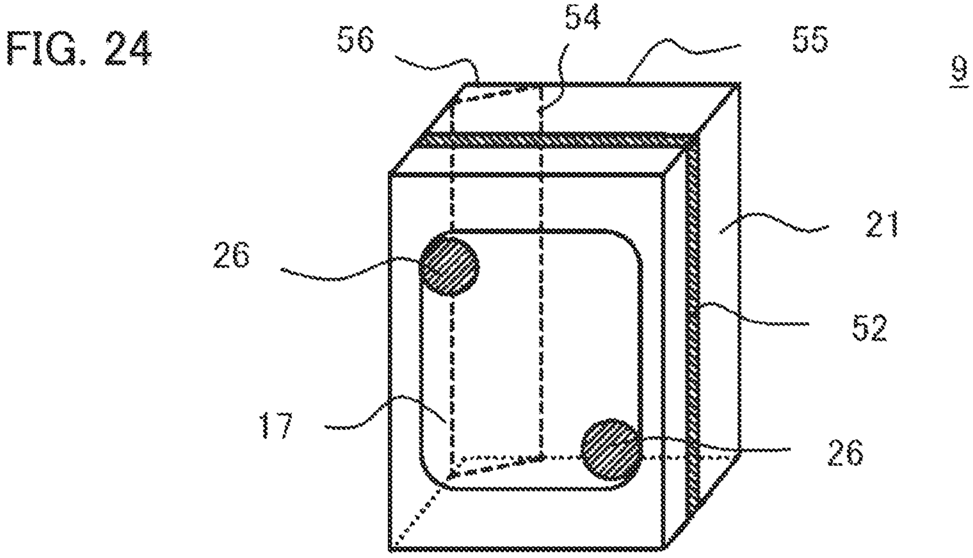
FIG. 24 is a perspective view showing the planar light receiving element before forming the processed face according to Embodiment 4.
Figure 25:
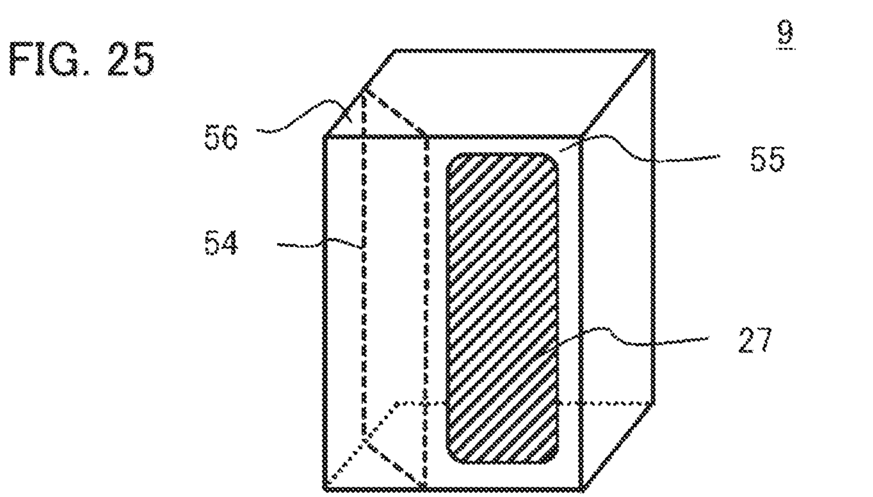
FIG. 25 is a perspective view showing the planar light receiving element before forming the processed face according to Embodiment 4.

FIG. 16 is a cross-sectional view showing a semiconductor laser device according to Embodiment 4, and FIG. 17 is a plan view showing the semiconductor laser device according to Embodiment 4. FIG. 18 is a cross-sectional view taken along the dashed line E2-E2 in FIG. 17, and FIG. 19 is a diagram for illustrating an inclination angle of a planar light receiving element of FIG. 16. FIG. 20, FIG. 21, and FIG. 22 are perspective views showing the planar light receiving element of FIG. 16 when viewed from respective different directions. FIG. 23, FIG. 24, and FIG. 25 are perspective views showing the planer light receiving element before forming a processed face according to Embodiment 4 when viewed from respective different directions. FIG. 16 is the cross-sectional view taken along the dashed line E1-E1 in FIG. 17. The semiconductor laser device 70 of Embodiment 4 is different from the semiconductor laser device 70 of Embodiment 1 in that the photodetector 10 is a planar light receiving element 9 and the planar light receiving element 9 is disposed on the first submount 11 with the light receiving face 17 of the planar light receiving element 9 inclined with respect to the stem front face 34 of the stem 1. A part different from the semiconductor laser device 70 of Embodiment 1 will be mainly described.

The planar light receiving element 9 includes the semiconductor substrate 21 such as an n-type InP substrate, an absorption layer 51 formed on the front face side of the semiconductor substrate 21, a window layer 52 formed on the front face side of the absorption layer 51, a p-type region 53 formed in the window layer 52, the reflective film 20 formed on the front face side of the p-type region 53, the anode electrode 26 connected to the p-type region 53, and the cathode electrode 27 formed on the rear face side of the semiconductor substrate 21. In addition, the planar light receiving element 9 has a processed face 54 in which a corner portion 56 including one side to which the rear face 55 of the semiconductor substrate 21 and one of the four side faces of the planar light receiving element 9 are connected is removed. Here, an example is shown in which the planer light receiving element 9 before the processed face 54 is formed has a rectangular parallelepiped shape as shown in FIG. 23 to FIG. 25. The rear face 55 of the planar light receiving element 9 before the processed face 54 is formed is rectangular. Here, an example is shown in which the processed face 54 is formed on the long side of the rear face 55 of the planar light receiving element 9 which is before the processed face 54 is formed.

A method of forming the processed face 54 of the planar light receiving element 9 may be, for example, wet etching and dry etching. When a structure in which different materials are stacked is etched by the wet etching, since the etching rate varies depending on the materials, it is difficult to adjust the angle of the etched face. Therefore, as the method of forming the processed face 54 of the planar light receiving element 9, the dry etching is used, and etching is performed while the planar light receiving element 9 before the processed face 54 is formed is inclined using a jig or the like. Since the face processed by the dry etching becomes the processed face 54, the unevenness of the processed face 54 affects the inclination angle α which is the angle between the light receiving face 17 and the dashed line 47 parallel to the stem front face 34 of the stem 1. Therefore, the processed face 54 of the planar light receiving element 9 is formed so as to adjust the inclination angle α. In FIG. 19, the inclination angle α is indicated by the angle between the dashed line 48 parallel to the light receiving face 17 and the dashed line 47 parallel to the stem front face 34 of the stem 1.

By adjusting the inclination angle θ of the second submount 12, the laser light 4 can be emitted from the semiconductor laser element 13 at a freely-selected angle. Further, by adjusting the inclination angle θ of the second submount 12 and the inclination angle α of the planar light receiving element 9, the semiconductor laser device 70 of Embodiment 4 can make the laser light 4 emitted from the semiconductor laser element 13 output the output light 6 along the optical axis 7 perpendicular to the stem front face 34 of the stem 1, similarly to the semiconductor laser device 70 of Embodiment 1. For example, the setting example of the inclination angle θ of the second submount 12 and the inclination angle α of the photodetector 10 can be the same as in Embodiment 1. The inclination angle θ of the second submount 12 is $90°-2\times(90°-\alpha)$ with respect to the inclination angle α of the photodetector 10, the output light 6 of the semiconductor laser device 70 of Embodiment 4 can be emitted along the optical axis 7 in the vertically upward direction with respect to the stem front face 34 of the stem 1.

The semiconductor laser device 70 of Embodiment 4 is disposed on the side to the stem front face 34 between the stem front face 34 and a farthest portion 59 of the photodetector 10 farthest away from the stem front face 34 of the stem 1 on which the semiconductor laser element 13 and the photodetector 10 are mounted. The farthest portion 59 of the photodetector 10 is a corner away from the stem 1 of the photodetector 10. In a case where the photodetector 10 is the planar light receiving element 9, for example, the corner portion 56 including one side between the front face in which the light receiving face 17 is formed and a side face connected to the front face is the farthest portion 59. In the semiconductor laser device 70 of Embodiment 4, similarly to the semiconductor laser device 70 of Embodiment 1, even in the case where the laser light 4 emitted from the semiconductor laser element 13, which is the semiconductor laser spreads out, the laser light 4 can be reflected by the light receiving face 17 of the photodetector 10 even up to the tail of the laser light 4. The semiconductor laser device 70 of Embodiment 4 has the same configuration as the semiconductor laser device 70 of Embodiment 1 except that the planar light receiving element 9 is disposed on the first submount 11 in a state where the light receiving face 17 of the planar light receiving element 9, which is the photodetector 10, is inclined with respect to the stem front face 34 of the stem 1, and therefore, the same effect as the semiconductor laser device 70 of Embodiment 1 is obtained.

Embodiment 5

Figure 26:
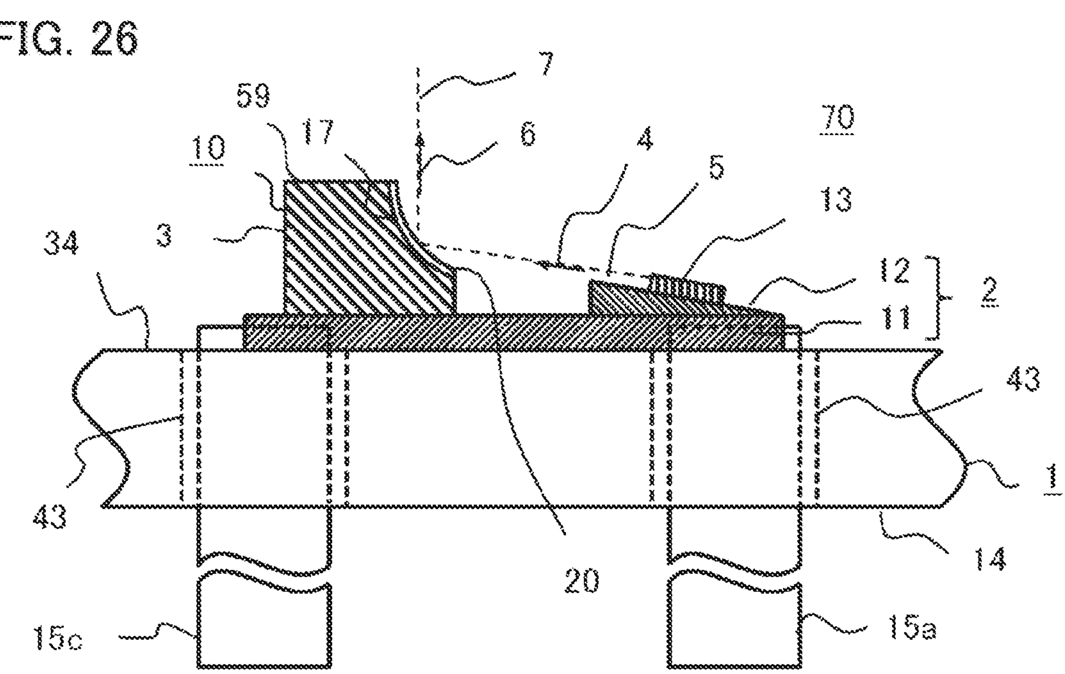
FIG. 26 is a cross-sectional view showing a semiconductor laser device according to Embodiment 5.
Figure 27:
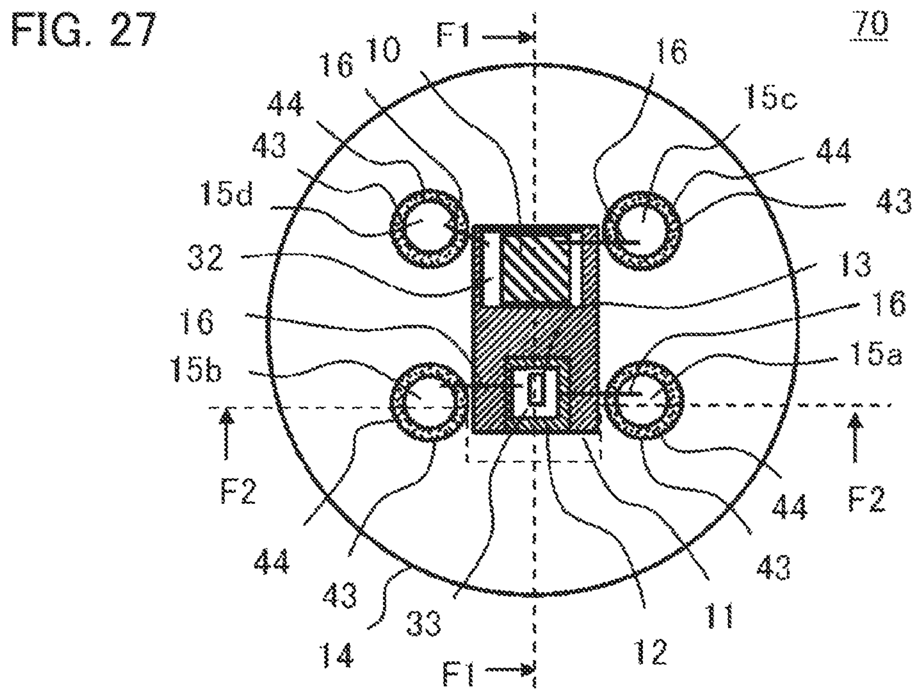
FIG. 27 is a plan view showing the semiconductor laser device according to Embodiment 5.
Figure 28:
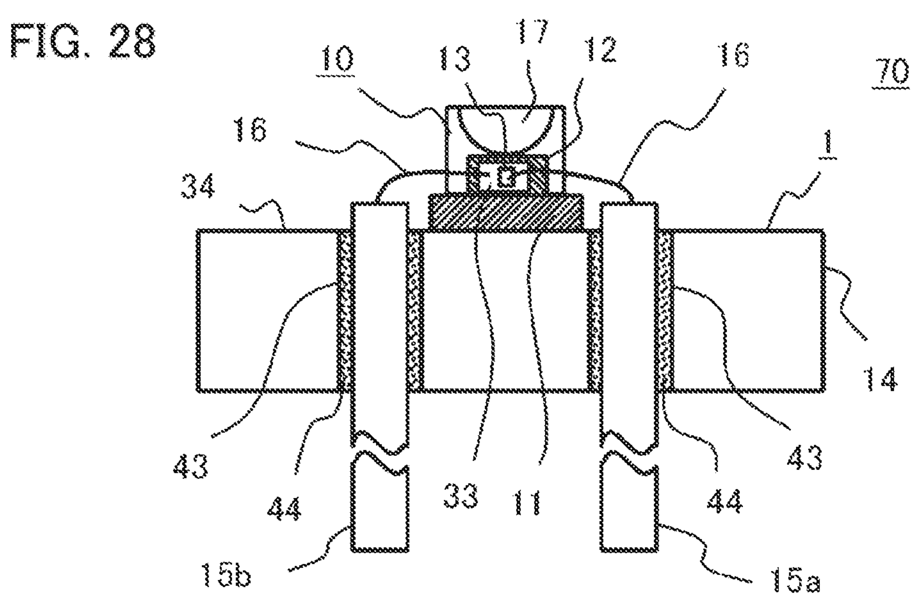
FIG. 28 is a cross-sectional view taken along the dashed line F2-F2 in FIG. 27.
Figure 29:
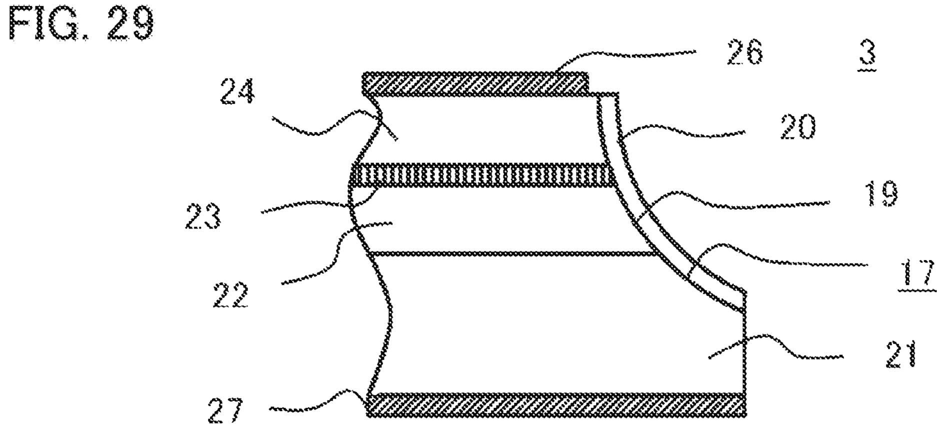
FIG. 29 is a perspective view of a waveguide type light receiving element of FIG. 26.

FIG. 26 is a cross-sectional view showing a semiconductor laser device according to Embodiment 5, and FIG. 27 is a plan view showing the semiconductor laser device according to Embodiment 5. FIG. 28 is a cross-sectional view taken along the dashed line F2-F2 in FIG. 27, and FIG. 29 is a perspective view showing a waveguide type light receiving element of FIG. 26. FIG. 26 is the cross-sectional view taken along the dashed line F1-F1 in FIG. 27. The semiconductor laser device 70 of Embodiment 5 is different from the semiconductor laser device 70 of Embodiment 1 in that the photodetector 10 is the waveguide type light receiving element 3 having a light receiving face 17 that is in a concave shape and recessed inwardly to the photodetector 10. A part different from the semiconductor laser device 70 of Embodiment 1 will be mainly described.

The waveguide type light receiving element 3 includes the semiconductor substrate 21 such as an n-type InP substrate, the first cladding layer 22 formed on the front face side of the semiconductor substrate 21, the absorption layer 23, the second cladding layer 24, the anode electrode 26, the cathode electrode 27 formed on the rear face side of the semiconductor substrate 21, and the reflective film 20 formed on a concave face 19 serving as the light receiving face 17. The concave face 19 serving as the light receiving face 17 is a face in a part of a large sphere including the concave face 19. In the waveguide type light receiving element 8 having the inclined face 18 of Embodiment 1, when the laser light 4 emitted from the semiconductor laser element 13 has a spread, the output light 6 having the spread even after being reflected by the inclined face 18 is emitted in the vertical direction. In contrast, in the waveguide type light receiving element 3 having the concave face 19 of Embodiment 5, even if the laser light 4 emitted from the semiconductor laser element 13 has the spread, the output light 6 focused by the concave face 19 can be emitted in the vertical direction.

About the concave face 19 formed in the waveguide type light, receiving element 3, a freely-selected focal length can be obtained by adjusting the spherical aberration by dry etching. The inclination angle θ of the second submount 12 is set in accordance with the design of the concave face 19 of the waveguide type light receiving element 3. By adjusting the inclination angle θ of the second submount 12 in accordance with the shape of the concave face 19 of the waveguide type light receiving element 3, the semiconductor laser device 70 of Embodiment 5 can make the laser light 4 emitted from the semiconductor laser element 13 output the output light 6 along the optical axis 7 perpendicular to the stem front face 34 of the stem 1.

In the semiconductor laser device 70 of Embodiment 5, the photodetector 10 includes the waveguide type light receiving element 3 having the light receiving face 17 in the concave shape, and the concave light receiving face 17 has a larger area than the beam diameter of the laser light 4 emitted from the semiconductor laser element 13. Therefore, similarly to the semiconductor laser device 70 of Embodiment 1, even in the case where the laser light 4 emitted from the semiconductor laser element 13, which is the semiconductor laser, spreads out, the laser light 4 can be reflected by the light receiving face 17 of the photodetector 10 even up to the tail of the laser light 4.

Embodiment 6

Figure 30:
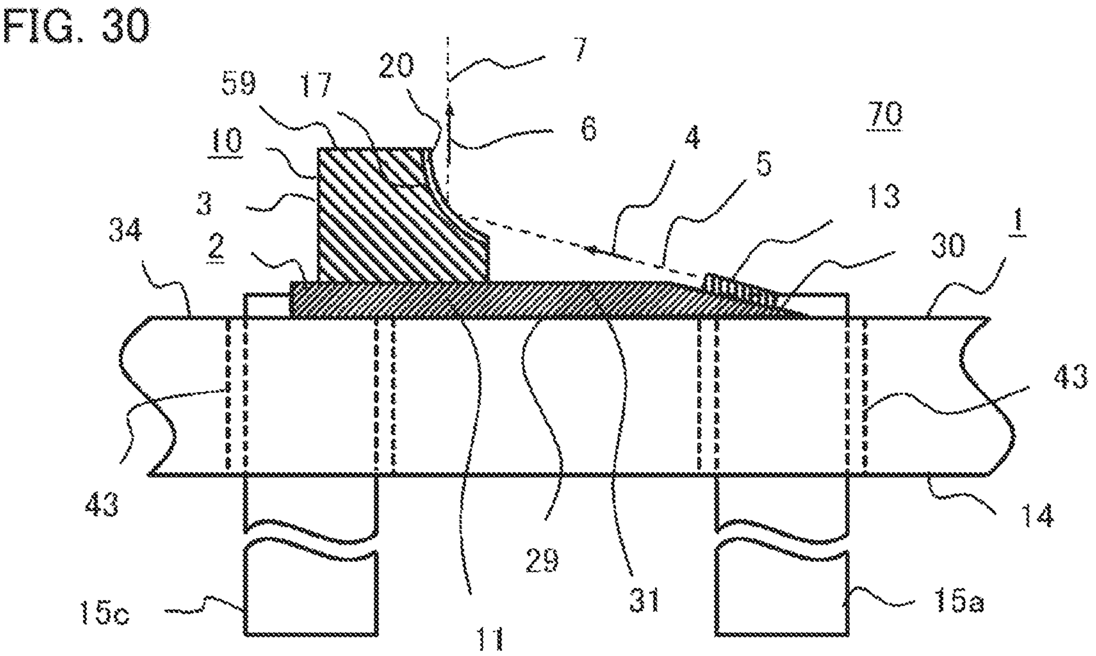
FIG. 30 is a cross-sectional view showing a semiconductor laser device according to Embodiment 6.
Figure 31:
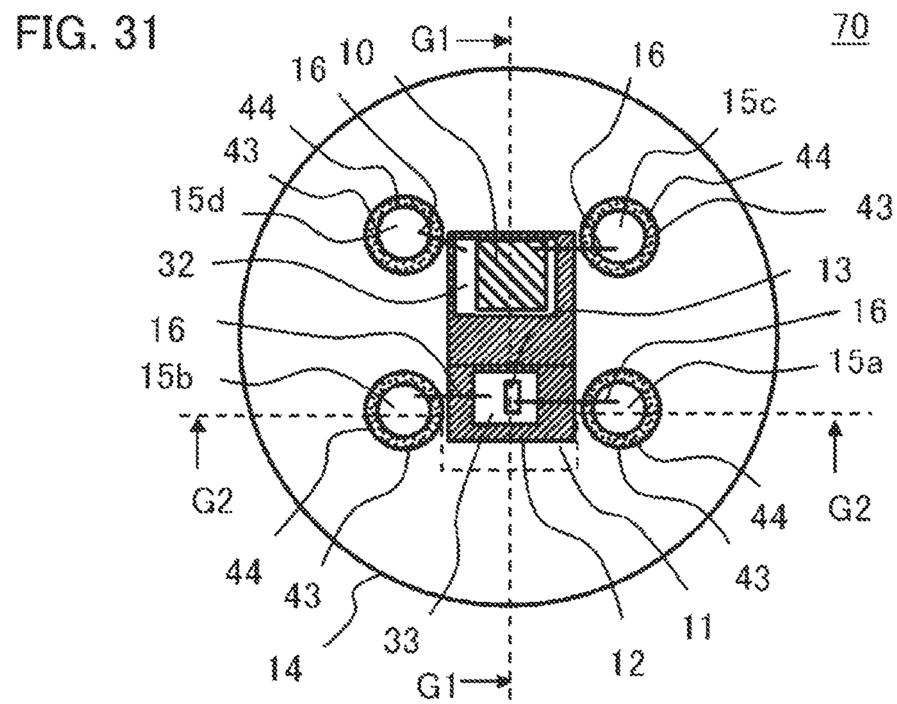
FIG. 31 is a plan view showing the semiconductor laser device according to Embodiment 6.
Figure 32:
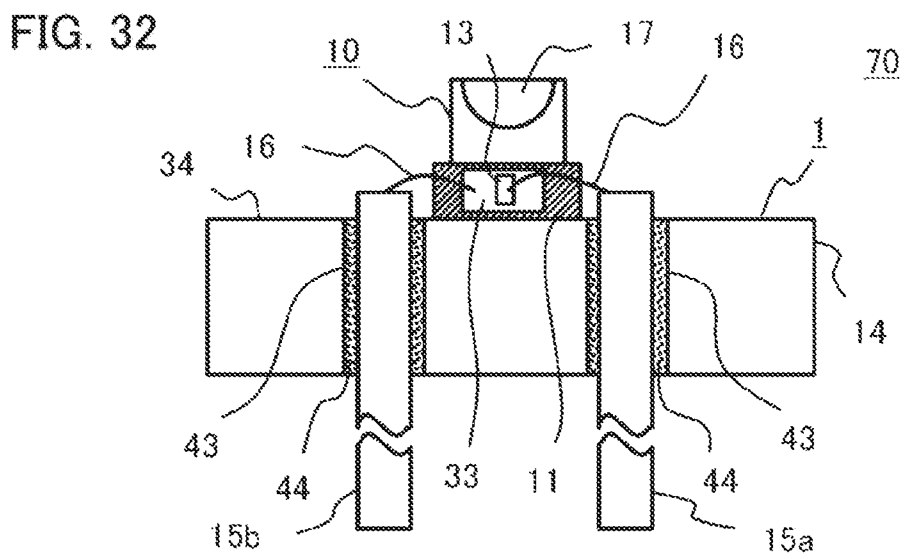
FIG. 32 is a cross-sectional view taken along the dashed line G2-G2 in FIG. 31.

FIG. 30 is a cross-sectional view showing a semiconductor laser device according to Embodiment 6. FIG. 31 is a plan view showing the semiconductor laser device according to Embodiment 6, and FIG. 32 is a cross-sectional view taken along the dashed line G2-G2 in FIG. 31. FIG. 30 is the cross-sectional view taken along the dashed line G1-G1 in FIG. 31. The semiconductor laser device 70 of Embodiment 6 is different from the semiconductor laser device 70 of Embodiment 5 in that the semiconductor laser device 70 of Embodiment 6 includes the submount 2 constituting the single first submount 11 having the inclined face 30. Note that, the semiconductor laser device 70 of Embodiment 6 is an example in which the waveguide type light receiving element 3 of Embodiment 5 is disposed in the submount 2 of Embodiment 2. A part different from the semiconductor laser device 70 of Embodiment 5 and Embodiment 2 will be mainly described.

The first submount 11 constituting the submount 2 of Embodiment 6 has the bottom face 29 connected to the stem 1, the front face 31 on which the photodetector 10 is disposed, and the inclined face 30 on which the semiconductor laser element 13 is disposed. The angle between the bottom face 29 and the inclined face 30 is the inclination angle θ. Since the semiconductor laser device 70 of Embodiment 6 includes the waveguide type light receiving element 3 having the concave face 19, similarly to the semiconductor laser device 70 of Embodiment 5, even if the laser light 4 emitted from the semiconductor laser device 13 has a spread, the output light 6 focused by the concave face 19 can be emitted in the vertical direction. Since the waveguide type light receiving element 3 is the same as that of the Embodiment 6, a freely-selected focal length can be obtained by adjusting the spherical aberration of the concave face 19 by the dry etching. The inclination angle θ of the first submount 11 is set in accordance with the design of the concave face 19 of the waveguide type light receiving element 3. By adjusting the inclination angle θ of the first submount 11 in accordance with the shape of the concave face 19 of the waveguide type light receiving element 3, the semiconductor laser device 70 of Embodiment 6 can make the laser light 4 emitted from the semiconductor laser element 13 output the output light 6 along the optical axis 7 perpendicular to the stem front face 34 of the stem 1.

In the semiconductor laser device 70 of Embodiment 6, the photodetector 10 includes the waveguide type light receiving element 3 having the light receiving face 17 in the concave shape, and the concave light receiving face 17 has a larger area than the beam diameter of the laser light 4 emitted from the semiconductor laser element 13. Therefore, similarly to the semiconductor laser device 70 of Embodiment 2, even in the case where the laser light 4 emitted from the semiconductor laser element 13, which is the semiconductor laser, spreads out, the laser light 4 can be reflected by the light receiving face 17 of the photodetector 10 even up to the tail of the laser light 4.

Embodiment 7

Figure 33:
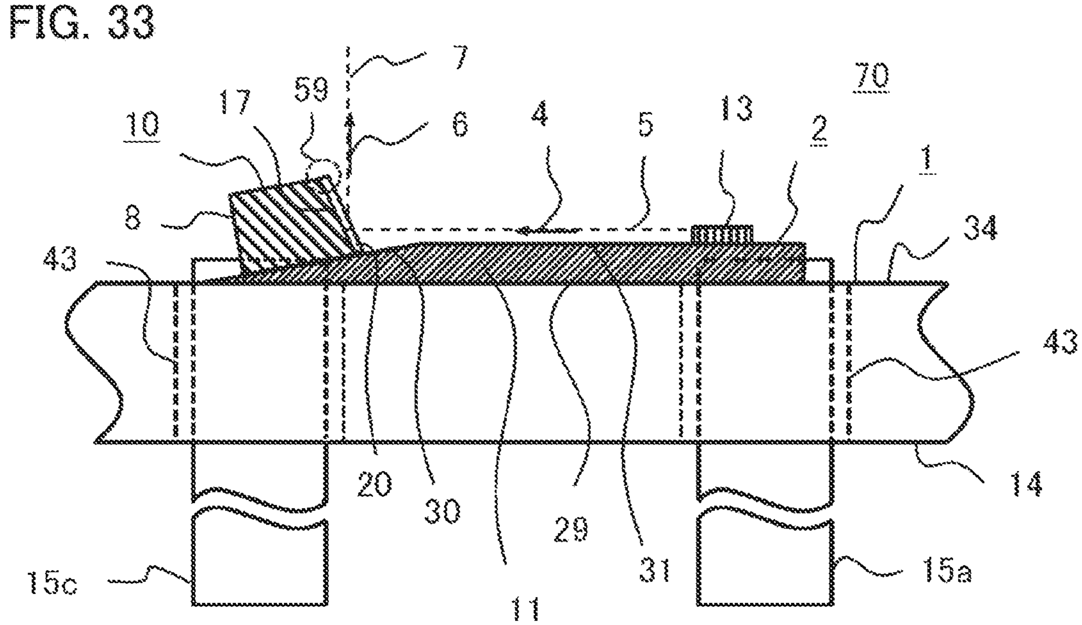
FIG. 33 is a cross-sectional view showing a semiconductor laser device according to Embodiment 7.
Figures 34, 35:
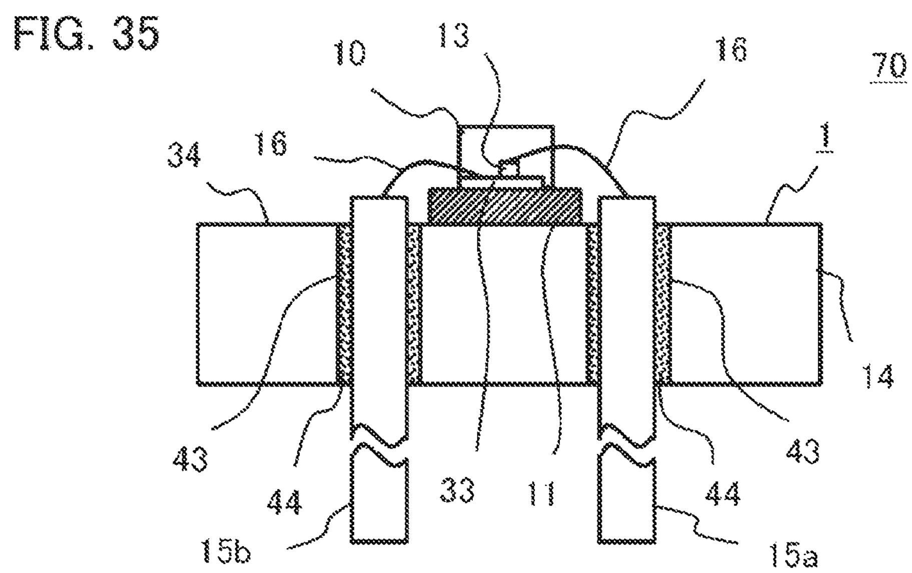
FIG. 34 is a plan view showing the semiconductor laser device according to Embodiment 7.
FIG. 35 is a cross-sectional view taken along the dashed line H2-H2 in FIG. 34.
Figure 36:
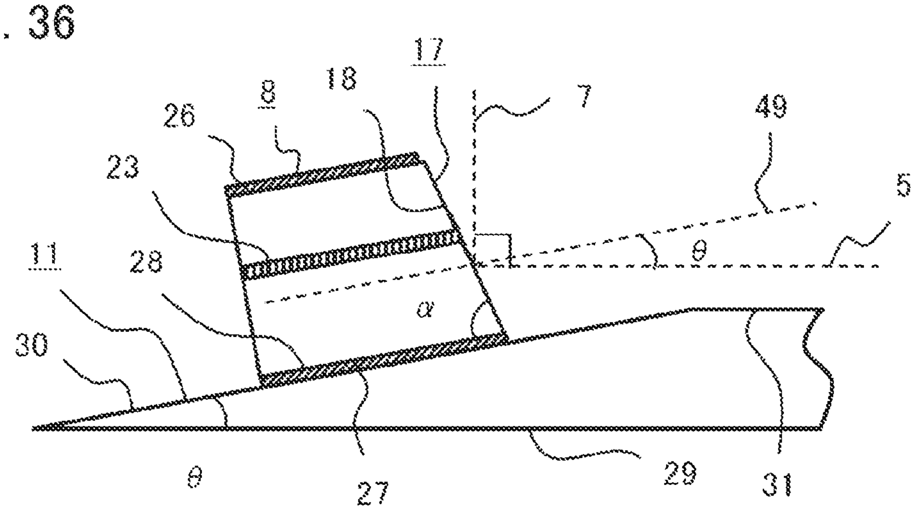
FIG. 36 is a diagram for illustrating an inclination angle of a waveguide type light receiving element and a first submount of FIG. 33.

FIG. 33 is a cross-sectional view showing a semiconductor laser device according to Embodiment 7, and FIG. 34 is a plan view showing the semiconductor laser device according to Embodiment 7. FIG. 35 is a cross-sectional view taken along the dashed line H2-H2 in FIG. 34, and FIG. 36 is a diagram for illustrating an inclination angle of a waveguide type light receiving element and a first submount of FIG. 33. FIG. 33 is the cross-sectional view taken along the dashed line H1-H1 in FIG. 34. The semiconductor laser device 70 of Embodiment 7 is different from the semiconductor laser device 70 of Embodiment 2 in that the semiconductor laser device 70 of Embodiment 7 includes the submount 2 constituting the single first submount 11 having the inclined face 30, the photodetector 10 disposed on the inclined face 30, and the semiconductor laser element 13 disposed on the front face 31 of the first submount 11. A part different from the semiconductor laser device 70 of Embodiment 2 will be mainly described.

The first submount 11 constituting the submount 2 of Embodiment 7 includes a bottom face 29 connected to the stem 1, the front face 31 on which the semiconductor laser element 13 is disposed, and the inclined face 30 on which the photodetector 10 is disposed. The inclined face 30 is an inclined portion of the submount 2 inclined with respect to the stem front face 34 of stem 1. The photodetector 10 is disposed on the inclined face 30 which is the inclined portion, and the semiconductor laser element 13 is disposed on the front face of the submount 2 except for the inclined portion, that is, on the front face 31 of the first submount 11. The angle of the inclined face 30 which is the inclined portion with respect to the bottom face 29 on the side to the stem 1 in the submount 2 is adjusted to an angle range in which the laser light 4 emitted from the semiconductor laser element 13 is received by the light receiving face 17 of the photodetector 10. The angle between the bottom face 29 and the inclined face 30 is the inclination angle θ. The photodetector 10 of Embodiment 7 is the waveguide type light receiving element 8 in which the light receiving face 17 has the inclined face 18 inclined with respect to the bottom face 28, similarly to the photodetector 10 of Embodiment 2. The angle between the bottom face 28 and the inclined face 18 is the inclination angle α. In the photodetector 10 of Embodiment 7, the inclined face 18 is formed by dry etching. As shown in FIG. 36, the angle between the dashed line 49 parallel to the inclined face 30 of the first submount 11 and the optical axis 5 is the inclination angle θ. The optical axis 5 is parallel to the front face 31 of the first submount 11 and the stem front face 34 of the stem 1. FIG. 36 shows an example in which the optical axis 5 and the optical axis 7 intersect at 90°; that is, the optical axis 5 and the optical axis 7 meet at right angles.

By adjusting the inclination angle θ of the first submount 11 and the inclination angle α of the photodetector 10, the laser light 4 from the semiconductor laser element 13 can be reflected at an freely-selected angle on the light receiving face 17 of the photodetector 10. Therefore, by adjusting the inclination angle θ of the first submount 11 and the inclination angle α of the waveguide type light receiving element 8, the semiconductor laser device 70 of Embodiment 7 can make the laser light 4 emitted from the semiconductor laser element 13 output the output light 6 along the optical axis 7 perpendicular to the stem front face 34 of the stem 1, similarly to the semiconductor laser device 70 of Embodiment 2. As the inclination angle θ of the first submount 11 increases, the position where the optical axis 5 of the laser light 4 and the light receiving face 17 meet can be brought closer to the front face side of the waveguide type light receiving element 8, that is, the anode electrode 26 side. When the laser light 4 is incident on the light receiving face 17 at the position of the absorption layer 23, the light receiving sensitivity of the waveguide type light receiving element 8 can be increased.

In the semiconductor laser device 70 of Embodiment 7, similarly to the semiconductor laser device 70 of Embodiment 2, even in the case where the laser light 4 emitted from the semiconductor laser element 13, which is the semiconductor laser, spreads out, the laser light 4 can be reflected by the light receiving face 17 of the photodetector 10 even up to the tail of the laser light 4. The semiconductor laser device 70 of Embodiment 7 has the same configuration as the semiconductor laser device 70 of Embodiment 2 except that the photodetector 10 having the light receiving face 17 formed by the dry etching is disposed on the inclined face 30 of the first submount 11 and the semiconductor laser element 13 is disposed on the front face 31 of the first submount 11, and thus the semiconductor laser device 70 of Embodiment 7 has the same effect as the semiconductor laser device 70 of Embodiment 2.

In the semiconductor laser device 70 according to Embodiment 1 to Embodiment 7, the sizes of the light receiving face 17 and the reflective film 20 of the photodetector 10 is larger than the size of the emission end face of the semiconductor laser element 13. The reason will be described. The laser light 4 emitted from the semiconductor laser element 13 spreads out until it reaches the photodetector 10. Therefore, in order not to reduce the amount of the output light 6, it is necessary to reflect the laser light 4 that spreads out, on the light receiving face 17 of the photodetector 10, and thus the sizes of the light receiving face 17 of the photodetector 10 and the reflective film 20 are larger than the size of the emission end face of the semiconductor laser element 13. Parameters determining the sizes of the light receiving face 17 and the reflective film 20 of the photodetector 10 are the distance between the semiconductor laser element 13 and the photodetector 10, and an allowable spread angle of the laser light 4.

Figure 37:
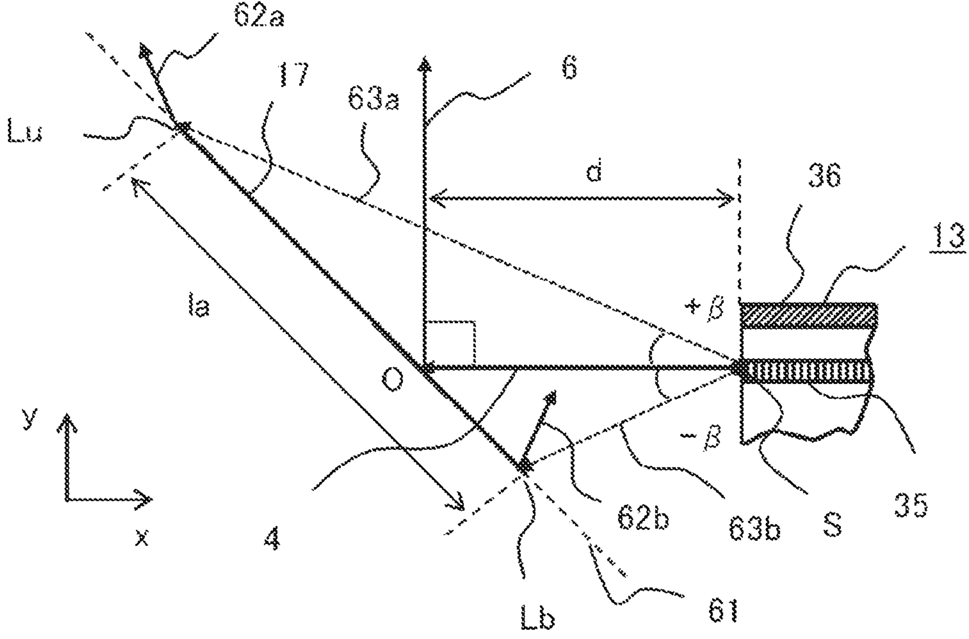
FIG. 37 is a diagram for illustrating the size of a light receiving face of a photodetector.

An example of the sizes of the light receiving face 17 and the reflective film 20 of the photodetector 10 is shown. FIG. 37 is a diagram for illustrating the size of the light receiving face of the photodetector. In FIG. 37, the length of the light receiving face 17 is the light receiving face length la. Referring to FIG. 36, the light receiving face length la is the length of the light receiving face 17 in the direction from the cathode electrode 27 to the anode electrode 26. It can be said that the light receiving face length la is the length from the arrival position of lower limit light 63*b* of allowable laser light 4 on the light receiving face 17 to the arrival position of upper limit light 63*a* of the allowable laser light 4 on the light receiving face 17. In FIG. 37, the reflective film 20 is omitted. The length of the reflective film 20 is equal to the light receiving face length la. FIG. 37 shows an example of the semiconductor laser device 70 of Embodiment 7. A dashed line 61 is a line parallel to the light receiving face 17. The direction opposite to the traveling direction of the laser light 4 emitted from an emission point S is defined as the x direction, and the traveling direction of the output light 6 perpendicular to the x direction is defined as the y direction. A point where the laser light 4 and the output light 6 intersect at the light receiving face 17 is defined as an origin O, an allowable upper limit point of the light receiving face 17 is defined as an upper limit point Lu, and an allowable lower limit point of the light receiving face 17 is defined as a lower limit point Lb. The allowable spread angle of the laser light 4 with reference to the x direction is $+\beta$ to $-\beta$. Let d be the distance from the emission point S to the origin O. The laser light whose spread angle of the laser light 4 is $+\beta$, that is, the upper limit light 63*a*, is reflected at the upper limit point Lu of the light receiving face 17 at a rate in accordance with the reflectance of the reflective film 20 to be reflected light 62*a*. The laser light whose spread angle of the laser light 4 is $-\beta$, that is, the lower limit light 63*b*, is reflected at the lower limit point Lb of the light receiving face 17 at the rate in accordance with the reflectance of the reflective film 20 to be reflected light 62*b*.

Here, a specific numerical example will be described. The height of the emission end face of the semiconductor laser element 13 is 100 μm, the length of the laser light in the optical axis direction is 300 μm, and the length perpendicular to these (the length of the semiconductor laser element 13 in the direction of the dashed line indicated by H2-H2 in FIG. 34) is 200 μm. The spread angle β is 20° and the distance d is 100 μm. In this case, the coordinates of the origin O are (0, 0), the coordinates of the upper limit point Lu are (−0.0572, 0.0572), the coordinates of the lower limit point Lb are (0.0267, −0.0267), and the light receiving face length la is 0.1187 mm, that is, 118.7 μm. Since the end of the light receiving face 17 in the farthest portion 59 of the photodetector 10 corresponds to the upper limit point Lu, the height of the upper limit point Lu of the light receiving face 17 in the photodetector 10 in the y direction from the origin O is 57.2 μm. Therefore, the height in the y direction from the emission point S of the semiconductor laser element 13 to the upper limit point Lu of the light receiving face 17 in the photodetector 10 is 57.2 μm. That is, when the distance between the semiconductor laser element 13 and the photodetector 10 is set to 100 μm and the spread angle of the laser light 4 is allowed to be within the range of +20° to −20°, the light receiving face 17 of the photodetector 10 should be located at a position higher than the emission point S of the semiconductor laser element 13 by about 60 μm or more. Note that, the height in the y direction from the emission point S of the semiconductor laser element 13 to the lower limit point Lb of the light receiving face 17 of the photodetector 10 is 26.7 μm. When the distance between the semiconductor laser element 13 and the photodetector 10 is set to 100 μm and the spread angle β of the laser light 4 is allowed to be within the range of +20° to −20°, the light receiving face 17 of the photodetector 10 should be located at a position lower than the emission point S of the semiconductor laser element 13 by about 27 μm or more. The longer the distance d, the longer the light receiving face length la.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1 stem, 2 submount, 3 waveguide type light receiving element, 4 laser light, 8 waveguide type light receiving, 9 planer light receiving element, 10 photodetector, 11 first submount, 12 second submount, 13 semiconductor laser element, 17 light receiving face, 18 inclined face, 19 concave face, 20 reflective film, 23 absorption layer, 29 bottom face, 30 inclined face (inclined portion), 31 front face, 34 stem front, face, 39 groove, inclined face, 45 bottom face, 46 inclined face (inclined portion), 54 processed face, 55 rear face, 56 corner portion, 59 farthest portion, 70 semiconductor laser device, θ inclination angle

The invention claimed is:

1. A semiconductor laser device comprising:

a semiconductor laser element;

a photodetector to receive laser light emitted from the semiconductor laser element; and a stem on which the semiconductor laser element and the photodetector are mounted, wherein the stem comprises a groove having an inclined face;

the semiconductor laser element is disposed on the inclined face of the groove of the stem via a submount and the photodetector is disposed on an other submount on the stem except for the inclined face of the groove of the stem;

an angle of the inclined face with respect to a stem front face of the stem is adjusted to an angle range in which the laser light emitted from the semiconductor laser element is received by the light receiving face of the photodetector;

the semiconductor laser element is disposed on a side to the stem front face between the stem front face and a farthest portion of the photodetector farthest away from the stem front face of the stem on which the semiconductor laser element and the photodetector are mounted; and the photodetector has a light receiving face for receiving the laser light and a reflective film formed thereon in which part of the laser light is transmitted and the rest is reflected, and is a waveguide type light receiving element having an absorption layer that absorbs laser light and extends on a side to the light receiving face, the light receiving face being formed on a side facing the semiconductor laser element, wherein the light receiving face of the photodetector is an inclined face inclined with respect to a rear face of the photodetector facing the stem front face of the stem.

2. The semiconductor laser device according to claim 1, further comprising a submount disposed between the semiconductor laser element and the stem, and the photodetector and the stem, wherein the submount includes an inclined portion inclined with respect to the stem front face of the stem;

the photodetector is disposed at the inclined portion;

the semiconductor laser element is disposed on a front face of the submount except for the inclined portion; and an angle of the inclined portion with respect to a bottom face on a side to the stem of the submount is adjusted to an angle range in which the laser light emitted from the semiconductor laser element is received by the light receiving face of the photodetector.

3. The semiconductor laser device according to claim 1, wherein the photodetector is disposed so as to reflect the laser light emitted from the semiconductor laser element perpendicularly to the stem front face of the stem.

* * * * *